(12) United States Patent
Ueda et al.

(10) Patent No.: US 7,829,418 B2
(45) Date of Patent: Nov. 9, 2010

(54) SEMICONDUCTOR APPARATUS AND METHOD FOR FABRICATING THE SAME

(75) Inventors: Yasuhiko Ueda, Tokyo (JP); Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 208 days.

(21) Appl. No.: 12/155,530

(22) Filed: Jun. 5, 2008

(65) Prior Publication Data
US 2008/0303086 A1     Dec. 11, 2008

(30) Foreign Application Priority Data
Jun. 7, 2007     (JP) .......................... P2007-151597

(51) Int. Cl.
*H01L 21/336* (2006.01)
(52) U.S. Cl. ...................... 438/270; 438/259; 257/330; 257/E21.384; 257/E21.419; 257/E21.428
(58) Field of Classification Search ................. 438/259, 438/270; 257/330, 331, E21.384, E21.419, 257/E21.428
See application file for complete search history.

(56) References Cited

U.S. PATENT DOCUMENTS

| | | | |
|---|---|---|---|
| 6,448,139 B2 | 9/2002 | Ito et al. | |
| 7,531,414 B2 * | 5/2009 | Park et al. | 438/270 |
| 2002/0106892 A1 * | 8/2002 | Shibata et al. | 438/637 |
| 2005/0001252 A1 | 1/2005 | Kim et al. | |
| 2005/0001266 A1 | 1/2005 | Kim | |
| 2005/0106794 A1 * | 5/2005 | Kuribayashi et al. | 438/197 |
| 2007/0004128 A1 * | 1/2007 | Jung | 438/243 |
| 2008/0199995 A1 * | 8/2008 | Woolsey et al. | 438/259 |
| 2009/0045411 A1 * | 2/2009 | Lin et al. | 257/77 |

FOREIGN PATENT DOCUMENTS

| | | |
|---|---|---|
| JP | 2001-351895 | 12/2001 |
| JP | 2003-229479 | 8/2003 |
| JP | 2004-140039 | 5/2004 |
| JP | 2005-79215 | 3/2005 |
| JP | 2005-142265 | 6/2005 |

OTHER PUBLICATIONS

Chinese Office Action dated Dec. 4, 2009 and English translation thereof.

* cited by examiner

*Primary Examiner*—N Drew Richards
*Assistant Examiner*—Yu-Hsi Sun
(74) *Attorney, Agent, or Firm*—McGinn IP Law Group, PLLC

(57) ABSTRACT

A semiconductor apparatus including a trench gate transistor having at least an active region surrounded by a device isolation insulating film; a trench provided by bringing both ends thereof into contact with the device isolation insulating film in the active region; a gate electrode formed in the trench via a gate insulating film; and a diffusion layer formed close to the trench; on a semiconductor substrate, and also includes an opening portion positioned on one surface of the semiconductor substrate; a pair of first inner walls positioned in a side of the device isolation insulating film and connected with the opening portion; a pair of second inner walls positioned in a side of the active region and connected with the opening portion; and a bottom portion positioned opposite to the opening portion and connected with the first inner walls and the second inner walls, wherein a cross sectional outline of the second inner wall is substantially linear, and a burr generated inside the trench is removed or reduced.

18 Claims, 18 Drawing Sheets

US 7,829,418 B2

SEMICONDUCTOR APPARATUS AND METHOD FOR FABRICATING THE SAME

BACKGROUND OF THE INVENTION

1. Field of the Invention

The present invention relates to a semiconductor apparatus provided with a trench gate structure, and the fabrication method thereof.

Priority is claimed on Japanese Patent Application No. 2007-151597, filed Jun. 7, 2007, the content of which is incorporated herein by reference.

2. Description of the Related Art

A semiconductor apparatus generally has a structure where an n-type diffusion layer, a gate insulating film, and a gate electrode are formed on the surface of a semiconductor substrate. However, as further refinement of the ultra large scale integration (ULSI) device is taking place, the problem of a short channel effect is becoming apparent.

The short channel effect refers to the following phenomenon. When a source electrode and a drain electrode become close as the gate length shortens, a leakage current flows between the source and drain (punch through) even if the gate is closed since silicon is a semiconductor with relatively high conductivity.

As a means for avoiding this short channel effect, trench gate technology has attracted attention. Trench gate technology refers to a method in which a trench is formed by engraving an Si substrate under a gate wiring and a gate is embedded in the trench, thereby enabling the elongation of channel length even with the same gate occupying area.

FIG. 16 shows a cross sectional structure of a semiconductor apparatus provided with such a conventional trench-embedded gate electrode.

In a semiconductor apparatus 101, a transistor structure T is formed between a pair of trench-type device isolation portions 102. Specifically, an n-type diffusion layer 104 to become a source region or a drain region is formed on the surface of a semiconductor substrate 103, which has a p-type well layer 103a and a channel doped layer 103b. In addition, a trench 105 is formed in the semiconductor substrate 103 and the n-type diffusion layer 104, and a source region and a drain region in the n-type diffusion layer 104 are divided by this trench 105. Moreover, a gate insulating film 106 is formed on the n-type diffusion layer 104, which includes the inner surface of the trench 105, and the device isolation portions 102. Additionally, a gate electrode 107 is embedded in the trench 105. The gate electrode 107 is embedded in the trench 105 via the gate insulating film 106. As described so far, the gate electrode 107 is formed between the source region and the drain region of the n-type diffusion layer 104 via the gate insulating film 106. In addition, electrodes 108 and 109 are formed on the source region and the drain region, respectively. Moreover, a silicon oxide film 110 is formed on the gate insulating film 106 and the electrodes 108 and 109 and the gate electrode 107 are disposed so as to be embedded in this silicon oxide film 110.

As described so far, according to the semiconductor apparatus 101 provided with a trench-embedded gate electrode by trench gate technology, by configuring the gate electrode 107 to be embedded in the trench 105, it is possible to control the effective channel length due to the trench depth and it is also possible to achieve a higher threshold voltage $V_{th}$ compared to that achieved by conventional planar-type semiconductor apparatuses.

However, the following problem is associated with conventional trench gate technology. That is, when processing a trench 205 by a plasma etching operation as shown in FIG. 17 and forming the trench 205 with respect to an active region K, which is shown in FIG. 17(a) as oblong shaped in a planar view, in the step for forming the trench 205, an Si burr 103c is readily formed beside the device isolation portions 102 as shown in FIG. 17(c), and this Si burr 103c acts as a parasitic channel.

A chemical etching process or a hydrogen annealing treatment is known to alleviate the problem of this Si burr 103c.

For example, Patent Document 1 (Japanese Unexamined Patent Application, First Publication No. 2001-351895) describes a method in which the trench shape is improved by the wet treatment using a mixed solution of hydrofluoric acid and nitric acid and the chemical etching process involving a short time heat treatment.

Additionally, Patent Documents 2 (Japanese Unexamined Patent Application, First Publication No. 2003-229479), 3 (Japanese Unexamined Patent Application, First Publication No. 2004-140039), and 4 (Japanese Unexamined Patent Application, First Publication No. 2005-142265) describe a method to flatten the inner wall of a trench by the hydrogen annealing treatment.

However, when the extent of Si burr is alleviated by subjecting the trench to an isotropic chemical etching process following a dry etching operation, a bottom portion 205b of the trench 205 will become round shaped as shown in FIGS. 18(b) and 18(c), and thus the effect of Si burr cannot be eliminated completely. Moreover, in the above case, cross sectional shape of the trench in the direction of A1-A1' line in FIG. 18(a) will deteriorate due to the excessive side etching. Thereafter, as shown in FIG. 19, the trench 205 is formed by removing a mask. However, the cross sectional shape of the trench 205 will be substantially circular and the central portion thereof in the depth direction will be a rounded dent, and thus the trench upper portion 205a will have a shape projecting inward. Since a transistor is produced from this state, for example, a transistor 201 shown in FIG. 20 will be configured by embedding the gate electrode 207 in the trench 205 via the gate insulating film 206, on electric field concentration readily occurs at the trench upper portion 205a and the risk of dimensional change will also be great.

In addition, when a hydrogen baking process (a heat treatment in a hydrogen atmosphere at about 900° C.) is conducted, as shown in FIG. 18(d), the Si burr can be eliminated substantially completely making a bottom portion of the trench 305b flat. However, similar to the abovementioned case, cross sectional shape of the trench in the direction of A1-A1' line will be substantially circular. Accordingly, when a transistor is produced as in the above case by removing a mask, an electric field concentration readily occurs at the trench upper portion and the risk of dimensional change will also be great.

The present invention is made in view of the above circumstances and its object is to provide a semiconductor apparatus and a fabrication method thereof in which the trench shape is optimized while efficiently removing the burr generated during the processing of the trench in the trench gate transistor, and in which a parasitic channel or a leakage current does not occur.

SUMMARY OF THE INVENTION

The present invention adopted the following aspects in order to achieve the above objects.

A semiconductor apparatus of the present invention is characterized by including a trench gate transistor having at least an active region surrounded by an device isolation insulating film; a trench provided by bringing both ends thereof into contact with the device isolation insulating film in the active region, a gate electrode formed in the trench via a gate insulating film; and a diffusion layer formed close to the trench on a semiconductor substrate, and which is configured from an opening portion positioned on one surface of the semiconductor substrate; a pair of first inner walls positioned in a side of the device isolation insulating film and connected with the opening portion; a pair of second inner walls positioned in a side of the active region and connected with the opening portion; and a bottom portion positioned opposite to the opening portion and connected with the first inner walls and the second inner walls, and in which a cross sectional outline of the second inner wall is substantially linear and the burr generated inside the trench is removed or reduced.

Additionally, in the semiconductor apparatus of the present invention, the cross sectional outline of the second inner walls will preferably have a ratio between the intermediate trench-width and the upper trench-width within a range of 0.9 to 1.05.

Moreover, in the semiconductor apparatus of the present invention, the burr height is preferably 5 nm or less from the bottom portion.

Furthermore, the semiconductor apparatus of the present invention is preferably dynamic random access memory which uses the trench gate transistor as a transfer gate transistor in a memory cell.

Next, the method for fabricating a semiconductor apparatus of the present invention is a method for fabricating the semiconductor apparatus provided with a trench gate transistor, and the method is characterized by including a step of providing a device isolation insulating film and an active region in a semiconductor substrate; a step of forming a trench in the active region; a step of removing or reducing a burr generated inside the trench; and a step of forming a gate insulating film inside the trench as well as forming a gate electrode in the trench, and in which the trench is provided so that both ends thereof are brought into contact with the device isolation insulating film, and configuring from an opening portion positioned on one surface of the semiconductor substrate; a pair of first inner walls positioned in a side of the device isolation insulating film and connected with the opening portion; a pair of second inner walls positioned in a side of the active region and connected with the opening portion; and a bottom portion positioned opposite to the opening portion and connected with the first inner walls and the second inner walls, and forming the second inner walls so that a cross sectional outline thereof is substantially linear, and the step of removing or reducing the burr generated inside the trench includes a first burr removing step in which the burr is removed or reduced by a hydrogen baking treatment; a step of forming a protection film in which the protection film is formed on the surface of the trench by an oxidation treatment; and a second burr removing step in which the trench surface where the protection film is formed is subjected to a hydrogen baking treatment to further remove or reduce the remaining burr while maintaining the cross sectional outline of the second inner walls substantially linear.

In addition, in the method for fabricating the semiconductor apparatus of the present invention, cross sectional outline of the second inner walls will preferably have a ratio between the intermediate trench-width and the upper trench-width within a range of 0.9 to 1.05.

Moreover, in the method for fabricating the semiconductor apparatus of the present invention, it is preferable that the burr height from the bottom portion be removed or reduced down to 20% or less in the first burr removing step, and that the burr height from the bottom portion be removed or reduced down to 5 nm or less in the second burr removing step.

Additionally, in the method for fabricating the semiconductor apparatus of the present invention, it is preferable that the hydrogen baking treatment be conducted so that the flow rate of hydrogen gas is at least 5 L/min or more and that the baking treatment is carried out at a temperature of 800 to 900° C.

Moreover, in the method for fabricating the semiconductor apparatus of the present invention, it is preferable that the protection film be formed continuously so that the film thickness is thick in the opening portion side and thin in the bottom portion side.

In addition, in the method for fabricating the semiconductor apparatus of the present invention, it is preferable that the oxidation treatment be carried out by using at least dichloroethylene.

Moreover, the semiconductor apparatus of the present invention is a semiconductor apparatus provided with a trench gate transistor and is characterized by including a gate electrode having its side surface portion embedded in a semiconductor substrate; a first and a second device isolation portion formed by sandwiching the gate electrode in a first direction; and a first and a second diffusion layer portion formed by sandwiching the gate electrode in a second direction, which is perpendicular to the first direction; and in which the side surface portion of the gate electrode is substantially brought into surface contact with the first and the second device isolation portions.

Additionally, in the semiconductor apparatus of the present invention, it is preferable that the gate electrode be substantially brought into surface contact with the first and the second device isolation portions.

Moreover, in the semiconductor apparatus of the present invention, it is preferable that the upper surface area of the gate electrode be smaller than the lower surface area of the gate electrode.

Additionally, in the semiconductor apparatus of the present invention, it is preferable that the gate electrode, which is a polyhedron, be a hexahedral gate electrode.

Moreover, another method for fabricating the semiconductor apparatus of the present invention is characterized by including a first step in which a trench for a trench gate is formed in a region sandwiched by device isolation portions, and the burr is formed between the trench and the device isolation portions; a second step in which a treatment for reducing the burr is carried out; a third step in which an oxidation treatment is carried out so that a higher side is more oxidized than a lower side inside the trench; and a fourth step in which a treatment for reducing the burr is carried out.

In addition, in the method for fabricating the semiconductor apparatus of the present invention, it is preferable that the treatment in the second and the fourth steps be a heat treatment.

Moreover, in the method for fabricating the semiconductor apparatus of the present invention, it is preferable that the heat treatment be a hydrogen baking treatment in which the flow rate of hydrogen gas is at least 5 L/min or more and the temperature is within a range of 800 to 900° C.

According to the present invention, it is possible to provide a semiconductor apparatus and a fabrication method thereof in which the trench shape is optimized while efficiently removing the burr generated during the processing of the trench in the trench gate transistor, and in which a parasitic channel or a leakage current does not occur.

In other words, according to the abovementioned semiconductor apparatus, a parasitic channel due to a burr is not generated since the cross sectional outline of the second inner walls that constitute the trench is substantially linear and the burr generated inside the trench is either removed or reduced, and a leakage current due to the short channel effect can also be prevented since the channel length is made long.

In addition, according to the abovementioned semiconductor apparatus, the cross sectional outline of the second inner walls of the trench has a ratio between the intermediate trench-width and the upper trench-width within a range of 0.9 to 1.05. Accordingly, the intermediate trench-width and the upper trench-width will have substantially the same size, and thus electric field concentration in the trench upper portion can be prevented.

Moreover, in the semiconductor apparatus of the present invention, the burr generated inside the trench is sufficiently removed or reduced by making the burr height 5 nm or less, thereby making it possible to avoid the occurrence of parasitic channels due to the burr.

Furthermore, according to the abovementioned method for fabricating a semiconductor apparatus, by having a first burr removing step in which the burr is removed or reduced by a hydrogen baking treatment; a step of forming a protection film in which the protection film is formed on the surface of the trench by an oxidation treatment; and a second burr removing step in which the trench surface where the protection film is formed is subjected to a hydrogen baking treatment to further remove or reduce the remaining burr while maintaining the cross sectional outline of the second inner walls substantially linear, Si migration inside the trench can actively be controlled due to the protection film, and thus the burr can be removed while optimizing the trench shape.

In addition, according to the abovementioned method for fabricating a semiconductor apparatus, the cross sectional outline of the second inner walls of the trench has a ratio between the intermediate trench-width and the upper trench-width within a range of 0.9 to 1.05. Accordingly, the intermediate trench-width and the upper trench-width will have substantially the same size, and thus electric field concentration in the trench upper portion can be prevented.

Moreover, according to the abovementioned method for fabricating a semiconductor apparatus, the burr is efficiently removed or reduced sufficiently by removing or reducing the burr height from the bottom portion down to 20% or less in the first burr removing step and by removing or reducing the burr height from the bottom portion down to 5 nm or less in the second burr removing step, thereby making it possible to avoid the occurrence of parasitic channels due to the burr.

In addition, according to the method for fabricating a semiconductor apparatus of the present invention, the hydrogen baking treatment is conducted so that the flow rate of hydrogen gas is at least 5 L/min or more and the baking treatment is carried out at a temperature of 800 to 900° C. Accordingly, the side etching ratio of a trench will be low and the effect of Si burr removal will also be achieved sufficiently.

Moreover, according to the abovementioned method for fabricating a semiconductor apparatus, the protection film is formed so that the film thickness is continuous being thick in the opening portion side and thin in the bottom portion side, thereby making the film thickness inversely proportional to the burr thickness, which is thick in the bottom portion and becomes thinner as it approaches the opening portion side. Accordingly, it will possible to control the effect of the hydrogen baking treatment in the second burr removing step based on the burr thickness, and thus the effect of burr removal will be optimal.

In addition, according to the abovementioned method for fabricating a semiconductor apparatus, the oxidation treatment is carried out by using at least dichloroethylene. Accordingly, damaged layers can efficiently be removed due to the action of chlorine, thereby enabling the enhancement of oxidation rate.

BRIEF DESCRIPTION OF THE DRAWINGS

FIG. 3(a) is a diagram showing the cross sectional structure of the trench as seen along the A-A' line in FIG. 1, and FIG. 3(b) is a diagram showing the cross sectional structure of the trench as seen along the B-B' line in FIG. 1.

FIG. 5(a) is a plan view in which an active region in FIG. 3 is expanded, and FIG. 5(b) and FIG. 5(c) are the cross sectional diagrams as seen along the A-A' line and along the B-B' line in FIG. 5(a), respectively.

FIG. 6(a) is a plan view in which the active region is expanded, and FIG. 6(b) and FIG. 6(c) are the cross sectional diagrams as seen along the A-A' line and along the B-B' line in FIG. 6(a), respectively.

FIG. 7(a) is a plan view in which the active region is expanded, and FIG. 7(b) and FIG. 7(c) are the cross sectional diagrams as seen along the A-A' line and along the B-B' line in FIG. 7(a), respectively.

FIG. 8(a) is a plan view in which the active region is expanded, and FIG. 8(b) and FIG. 8(c) are the cross sectional diagrams as seen along the A-A' line and along the B-B' line in FIG. 8(a), respectively.

FIG. 9(a) is a plan view in which the active region is expanded, and FIG. 9(b) and FIG. 9(c) are the cross sectional diagrams as seen along the A-A' line and along the B-B' line in FIG. 9(a), respectively.

FIG. 10(a) is a plan view in which the active region is expanded, and FIG. 10(b) and FIG. 10(c) are the cross sectional diagrams as seen along the A-A' line and along the B-B' line in FIG. 10(a), respectively.

FIG. 11(a) is a plan view in which the active region is expanded, and FIG. 11(b) and FIG. 11(c) are the cross sectional diagrams as seen along the A-A' line and along the B-B' line in FIG. 11(a), respectively.

FIG. 12(a) is a plan view in which the active region is expanded, and FIG. 12(b) and FIG. 12(c) are the cross sectional diagrams as seen along the A-A' line and along the B-B' line in FIG. 12(a), respectively.

FIG. 17(a) is a plan view in which the active region is expanded, and FIG. 17(b) and FIG. 17(c) are the cross sectional diagrams as seen along the A-A' line and along the B-B' line in FIG. 17(a), respectively.

FIG. 18(a) is a plan view in which the active region is expanded, and FIG. 18(b) and FIG. 18(c) are the cross sectional diagrams as seen along the A-A' line and along the B-B' line in FIG. 18(a), respectively.

FIG. 19(a) is a plan view in which the active region is expanded, and FIG. 19(b) and FIG. 19(c) are the cross sectional diagrams as seen along the A-A' line and along the B-B' line in FIG. 19(a), respectively.

DETAILED DESCRIPTION OF THE INVENTION

A semiconductor apparatus and a fabrication method thereof according to the embodiments of the present invention are described below in conjunction with the attached diagrams. Note that the diagrams referred to in the following description are for illustrating the semiconductor apparatus and the fabrication method thereof according to the present embodiment and size, thickness, or dimension of each component illustrated in the diagrams may be different from the actual dimensional relationship of each component in the semiconductor apparatus and the fabrication method thereof.

<Semiconductor Apparatus>

Figure 1:
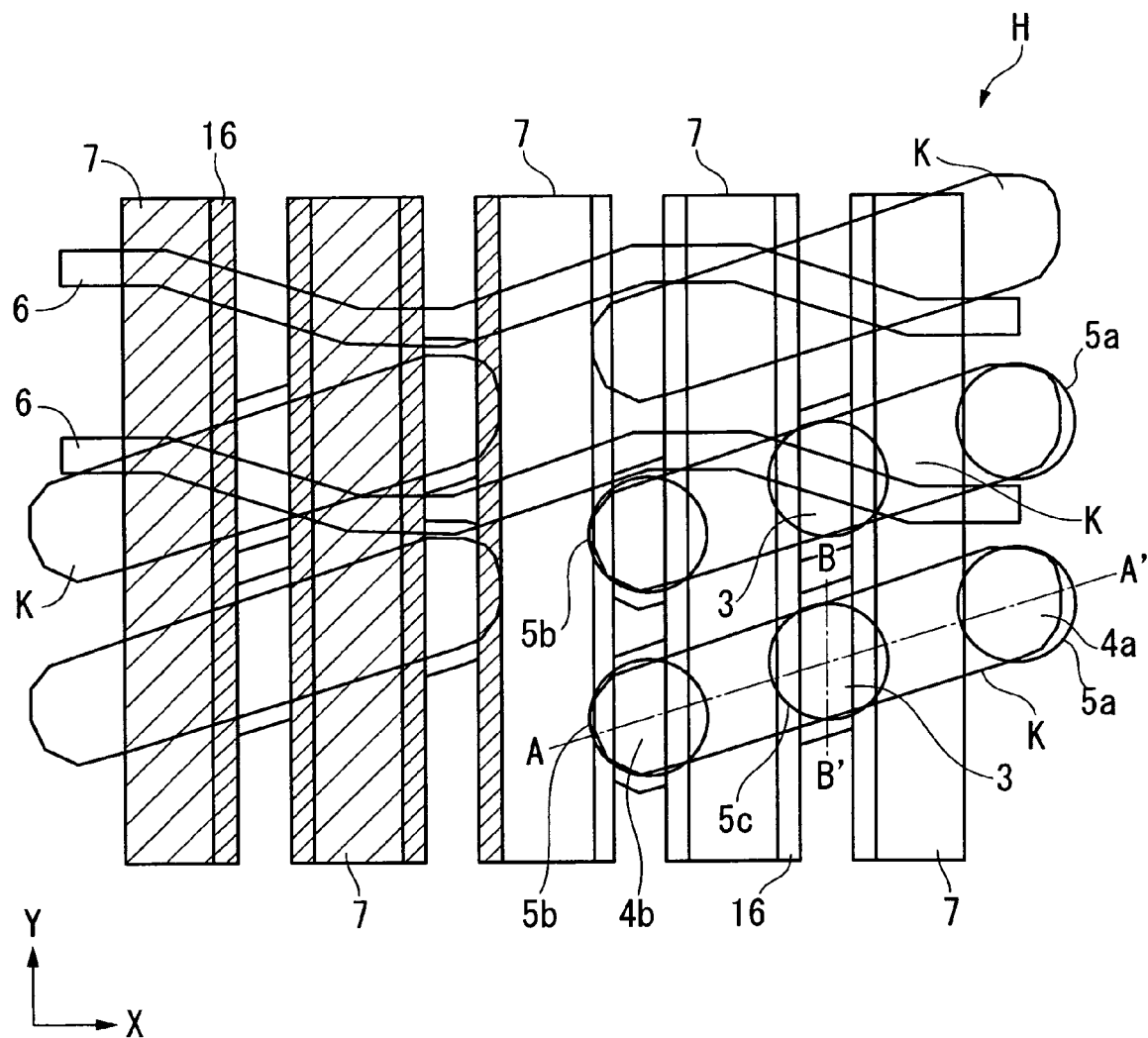
FIG. 1 is a schematic diagram showing a planar structure of a semiconductor apparatus according to an embodiment of the present invention.
Figure 2:
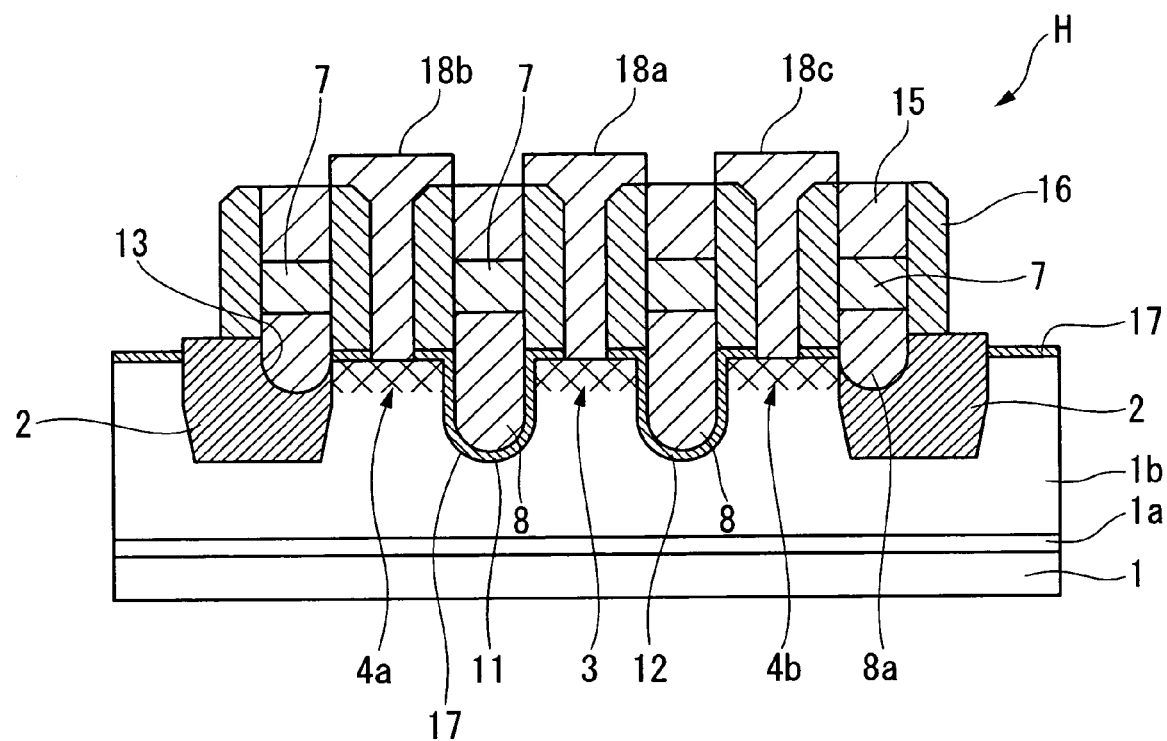
FIG. 2 is a schematic diagram showing a cross sectional structure of the semiconductor apparatus according to an embodiment of the present invention.

FIG. 1 is a schematic diagram showing a planar structure of a semiconductor apparatus H according to an embodiment of the present invention, and FIG. 2 is a schematic diagram showing a cross sectional structure as seen along the A-A' line in FIG. 1.

In these diagrams, a semiconductor substrate 1 employed in the semiconductor apparatus H is formed of a semiconductor such as silicon that contains a predetermined concentration of impurities.

A device isolation insulating film (trench isolation insulating film) 2 is formed on the surface of the semiconductor substrate 1 in a region other than an active region K by the shallow trench isolation (STI) method and dielectrically isolates the adjacent active region K. In this embodiment, one example of a structure where the present invention is applied to a cell structure, in which a 2-bit memory cell is disposed in one active region K, is shown.

In the structure of the present embodiment as seen in the planar structure shown in FIG. 1, a plurality of active regions K having a long slender strip shape are formed by being arranged with a predetermined interval between each active region, and impurity diffusion layers are disposed at both ends and at the central portion of each active region K. In this embodiment, a drain 3 is formed in the central portion, and sources 4a and 4b are formed in both sides thereof, thereby defining substrate contact portions 5c, 5a, and 5b that are each arranged directly above thereof.

It should be noted that although a planar shape of the active region K specified in this diagram is a shape unique to the present embodiment, the shape or direction of the active region K should not be specified in particular. Accordingly, it goes without saying that the shape of the active region K shown in FIG. 1 may be any shape of the active region applied in other general trench gate transistors and not be specific to the shape of the present invention.

Next, a bit line 6 is arranged by being extended in the transverse (X) direction of FIG. 1 in a creased line form, and a plurality of bit lines 6 are disposed in the longitudinal (Y) direction of FIG. 1 with a predetermined interval. In addition, linear word lines 7 are arranged by being extended in the longitudinal (Y) direction of FIG. 1, and a plurality of these word lines 7 are disposed in the transverse (X) direction of FIG. 1 with a predetermined interval. The word lines 7 are configured so as to include a gate electrode 8 shown in FIG. 2 at a portion where they intersect with each active region K.

As seen in the cross sectional structure shown in FIG. 2, in a semiconductor substrate 1, a p-type well layer 1a and a channel doped layer 1b are formed in this order, and the source 4a, the drain 3, and the source 4b are formed thereon with a space in between in the active region K divided by the device isolation insulating film 2.

Trenches 11 are formed between the source 4a and the drain 3 and between the drain 3 and the source 4b by engraving the semiconductor substrate 1. Trenches 13 are also formed on the device isolation insulating film 2 positioned on both sides of these trenches 11.

These trenches 11 are continuously formed along the word lines 7 so that both end portions thereof are brought into contact with the trench isolation insulating film 2.

A gate insulating film 17 is formed throughout from the inner circumferential surface of the trenches 11 to the position of substrate upper surface in the peripheral portion of each trench. A gate electrode 8 is formed inside each of the gate insulating film 17 of the trenches 11 so as to contact each gate insulating film 17 and to protrude above each trench to some extent. The word lines 7 and a hard mask 15 made of an insulating film are formed by lamination on each gate electrode 8. LDD side walls 16 are formed so as to be positioned on both sides of the upper portion side of the gate electrode 8 protruding upward from the semiconductor substrate 1, portion of the word lines 7, and the hard mask 15, which is made of an insulating film, that are laminated in this order. Note that a gate electrode material 8a is also formed inside the trenches 13 formed on the device isolation insulating film 2, and the word line 7 and the hard mask 15 made of an insulating film are formed thereon by lamination.

In the structure of the present embodiment, one trench gate transistor is formed from the gate insulating film 17 formed in at least one of the trenches 11, the gate electrode 8, and the source 4a and the drain 3 disposed on each side thereof. Moreover, another trench gate transistor is formed from the gate insulating film 17 formed in the other trench 11, the gate electrode 8, and the drain 3 and the source 4b disposed on each side thereof. By forming a plurality of these trench gate transistors by arranging them in the transverse (X) direction and in the longitudinal (Y) direction of FIG. 1, a selected transistor unit for a DRAM memory cell is configured.

In such a structure of the trench gate transistor, as one example thereof, the gate insulating film 17 is formed as a silicon oxide film by a thermal oxidation process, the gate electrode 8 is formed from a polycrystalline silicon film, the word lines 7 are formed from a metal film, and the side walls 16 are formed from an insulating film such as silicon nitride.

Figure 3:
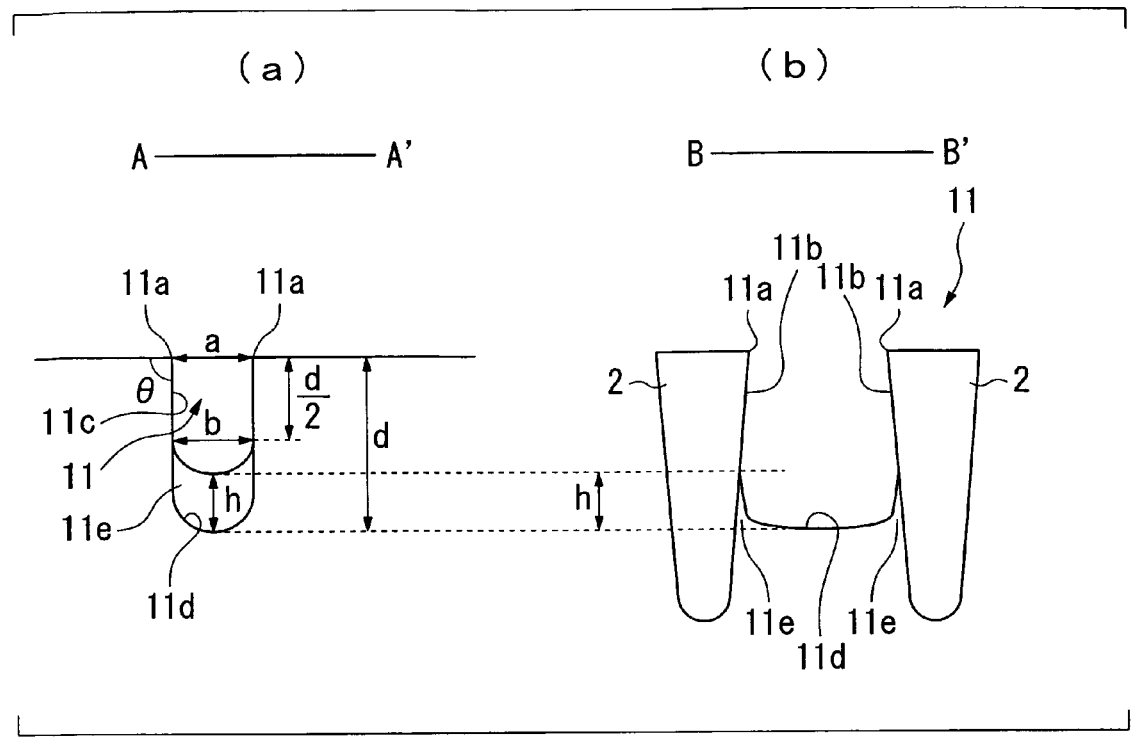
FIG. 3 is a diagram illustrating a trench shape of the semiconductor apparatus according to an embodiment of the present invention.

As shown in FIG. 3 for example, the trenches 11 are configured from an opening portion 11a positioned on one surface of the semiconductor substrate 1, a pair of first inner walls 11b, which are positioned in the side of the trench isolation insulating film 2 placed on the left and right hand sides in the cross sectional structure shown in FIG. 3 and are connected with the opening portion 11a, a pair of second inner walls 11c, which are positioned in the active region K side and are connected with the opening portion 11a, and a bottom portion 11d positioned opposite to the opening portion 11a and connected with the first inner walls 11b and the second inner walls 11c. The trenches 11 are configured so that the cross sectional outline of the second inner walls 11c is substantially linear and that the Si burr generated on the surface of the first inner walls 11b from the direction of the bottom portion 11d is either removed or reduced.

With such a configuration, a parasitic channel due to the Si burr is not generated and a leakage current due to the short channel effect can also be prevented since the channel length is made long.

In addition, as shown in FIG. 3(a), it is preferable that the cross sectional outline of the second inner walls 11c has a ratio between the intermediate trench-width b and the upper trench-width a (=b/a) within a range of 0.9 to 1.05. When the ratio is within this range, the upper trench-width a and the intermediate trench-width b will substantially be the same size, and thus electric field concentration in the upper portion of the trenches 11 can be prevented.

Moreover, it is preferable that the angle θ formed between the surface where the opening portion 11a is positioned and the second inner walls 11c be within a practical range, that is, $87° \leq \theta \leq 93°$. When the angle is within this range, the trench shape is optimized and it will be possible to prevent electric field concentration in the trench upper portion.

Furthermore, as shown in FIG. 3(b), it is preferable that height h of the burr from the bottom portion 11d be 5 nm or less. When the height is within this range, the burr is sufficiently removed or reduced and it will be possible to avoid the generation of parasitic channels due to the burr. In addition, the bottom portion 11d is preferably flat in the cross section of the first inner walls 11b.

Note that in FIG. 2, conductor portions 18a, 18b, and 18c for contacting the substrate are formed by lamination in the upper sides of the drain 3 and the sources 4a and 4b, and the substrate contact portions 5a, 5b, and 5c shown in FIG. 1 are configured from these conductor portions. Accordingly, it is configured so as to be capable of being connected to a DRAM capacitor structure when the semiconductor apparatus having the configuration of the present embodiment is applied to the dynamic random access memory (hereinafter abbreviated as DRAM) described later.

The semiconductor apparatus having a trench gate transistor structure of the present embodiment described so far will be characterized in that the trench shape is optimized while efficiently removing the Si burr generated during the processing of the trench in the trench gate transistor, and that it is free from problems such as the generation of parasitic channels, electric field concentration, or a leakage current.

<Fabrication Method of Semiconductor Apparatus>

Next, one example of a method for fabricating the semiconductor apparatus H having a trench gate transistor structure according to the present embodiment will be described in step order by referring to FIGS. 4 to 12.

Generally speaking, the method for fabricating a transistor having a trench gate structure is configured from a step for providing a device isolation insulating film and an active region in a semiconductor substrate (device isolation step), a step for forming a trench inside the active region (trench forming step), a step for removing or reducing the burr generated inside the trench (burr removing step), a step for forming a gate insulating film inside the trench as well as forming a gate electrode in the trench (gate electrode forming step), and a step for forming a diffusion layer close to the trench (diffusion layer forming step).

Each step will be described below, one by one.

[Device Isolation Step]

Figure 4:
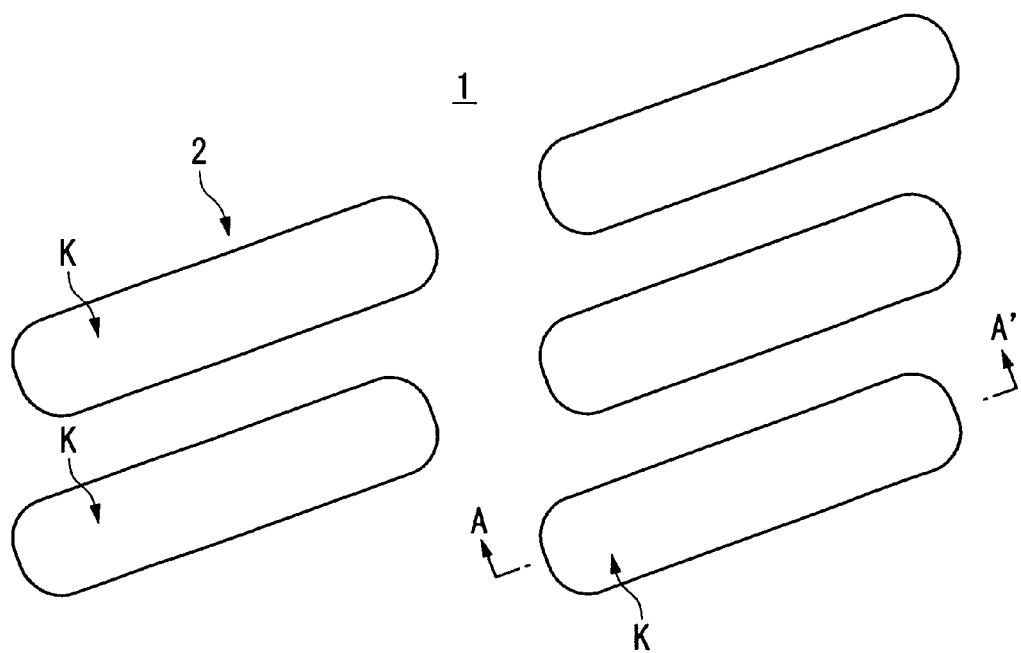
FIG. 4 is a flow chart when fabricating the semiconductor apparatus according to an embodiment of the present invention, and is a plan view showing a state where a device isolation insulating film is formed.

As shown in FIG. 4, the device isolation insulating film 2 having a depth of about 200 to 350 nm is first formed on the semiconductor substrate 1 by the STI method. By the formation of this device isolation insulating film 2, an island active region K is formed on the semiconductor substrate 1.

Figure 5:
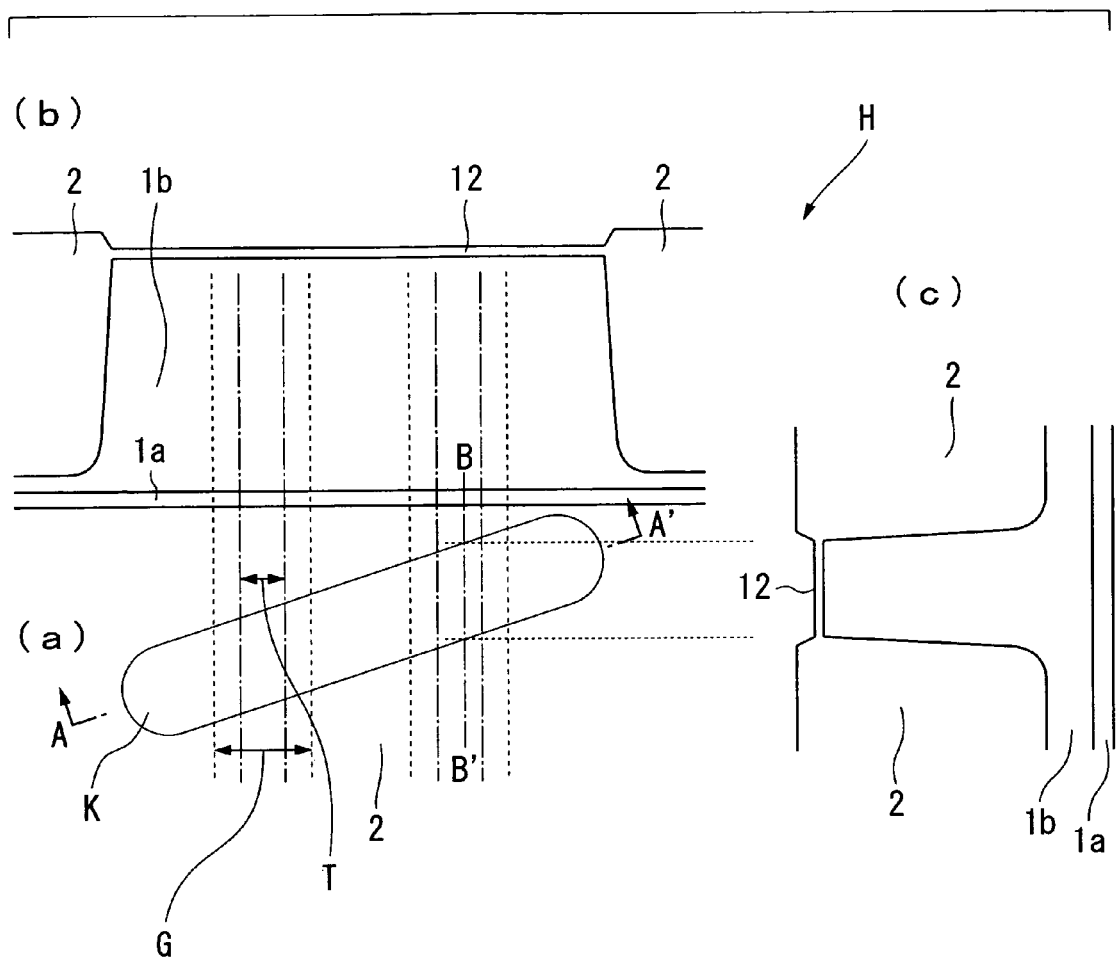
FIG. 5 is a flow chart when fabricating the semiconductor apparatus according to an embodiment of the present invention.

As shown in FIG. 5, an insulating film 12 is then formed so as to cover the active region K and the device isolation insulating film 2 in the semiconductor substrate 1.

A p-type well layer 1a is formed by firstly forming, for example, a silicon oxide film having a thickness of 10 to 20 nm by the chemical vapor deposition (CVD) method, and thereafter implanting boron thereto. Examples of the conditions for boron implantation include, through a silicon oxide film, an implant dose of $1 \times 10^{13}$ cm$^{-2}$ at an implant energy of 250 keV, an implant dose of $5 \times 10^{12}$ cm$^{-2}$ at an implant energy of 150 keV, and an implant dose of $3 \times 10^{12}$ cm$^{-2}$ at an implant energy of 80 keV. After implanting boron, a heat treatment is conducted for the damage recovery. Examples of the conditions for the heat treatment in this case include a treatment at 1,000° C. for 1 minute.

Subsequently, boron is implanted through the silicon oxide film and the channel doped layer 1b is formed on the p-type well layer 1a. Examples of the conditions for boron implantation at this stage include an implant dose of $2 \times 10^{12}$ cm$^{-2}$ at an implant energy of 30 keV.

Furthermore, the insulating film 12 is formed by laminating, for example, a silicon nitride film having a thickness of 100 to 200 nm by the CVD method so as to cover the silicon oxide film.

[Trench Forming Step]

Figure 6:
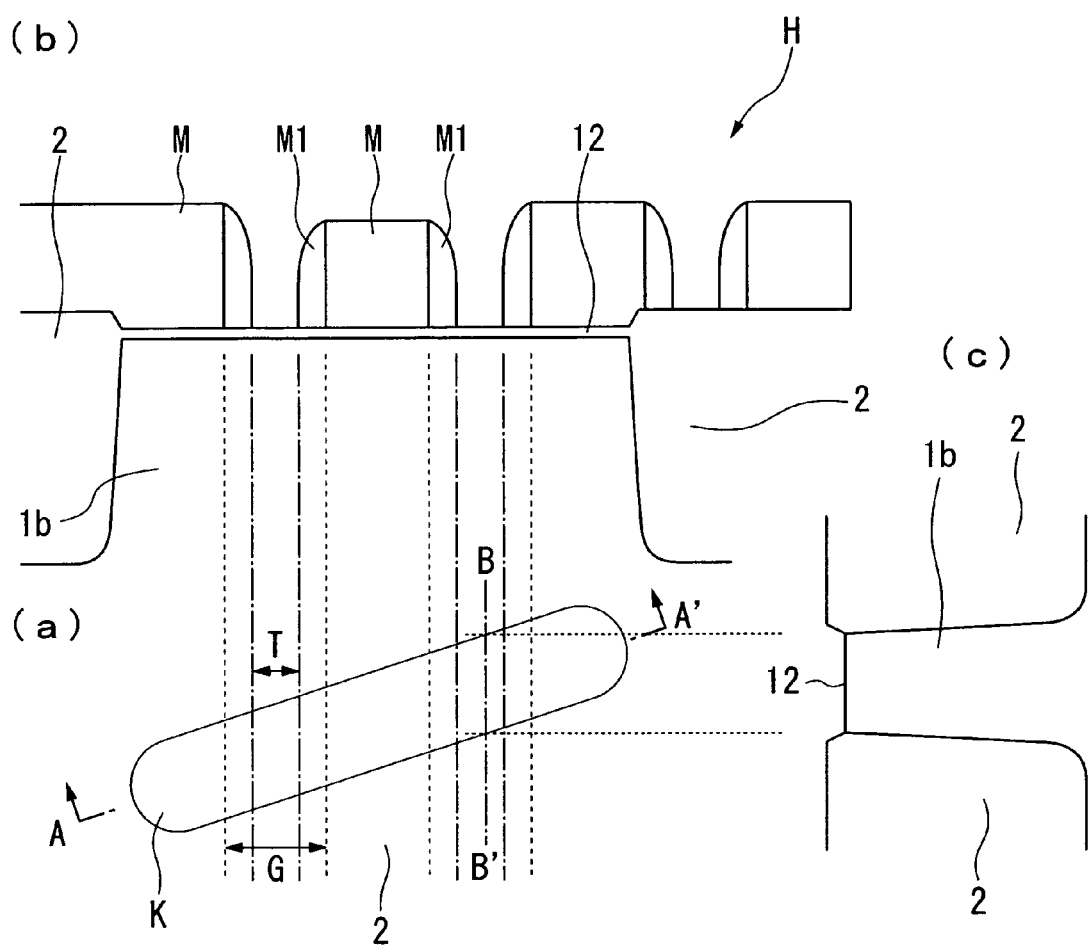
FIG. 6 is a flow chart when fabricating the semiconductor apparatus according to an embodiment of the present invention, and is a schematic diagram showing a state where a mask and side walls are formed.

Next, as shown in FIG. 6, by selectively removing the film (mask) that is in a predetermined region where the gate electrode should be formed by a photolithography technique and a dry etching technique, an opening portion 11a is formed, thereby forming a mask pattern M for forming a gate trench.

Moreover, side walls M1 are formed around the mask pattern M.

Figure 7:
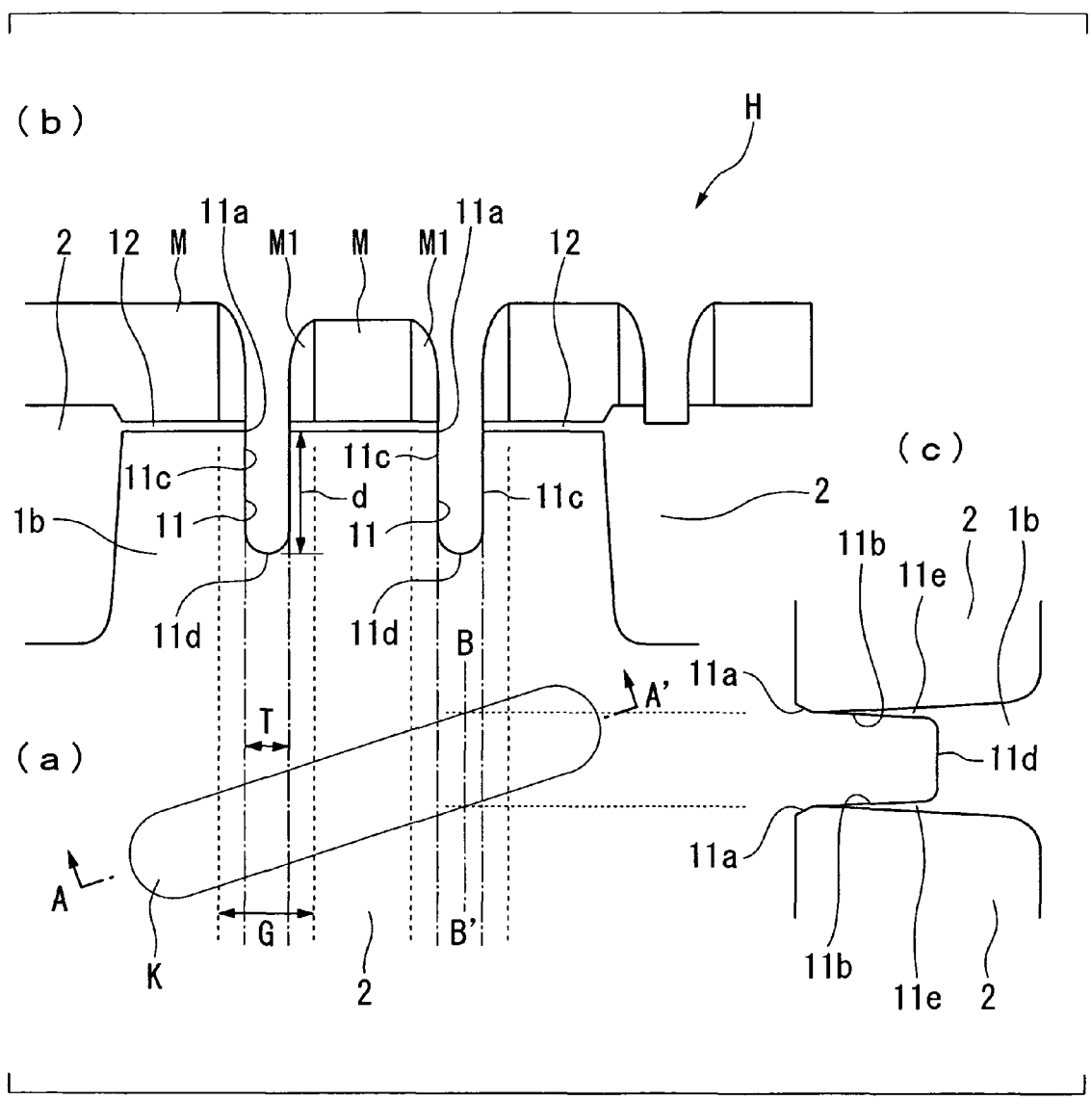
FIG. 7 is a flow chart when fabricating the semiconductor apparatus according to an embodiment of the present invention, and is a schematic diagram showing a state where a trench gate is formed.

By subjecting the channel doped layer 1b to a dry etching process using this mask pattern M, two trenches 11 are formed with a predetermined interval as shown in FIG. 7. Depth d of the trenches 11 is preferably about 100 to 200 nm, for example.

The trenches 11 are formed so as intersect the active region K, and are also configured from an opening portion 11a, which is provided so that both ends with the trenches 11 in the active region K are brought into contact with the device isolation insulating film 2 and is positioned on one surface of the semiconductor substrate 1, a pair of first inner walls 11b, which are positioned in the side of the device isolation insulating film 2 and are connected with the opening portion 11a, a pair of second inner walls 11c, which are positioned in the active region K side and are connected with the opening portion 11a, and a bottom portion 11d positioned opposite to the opening portion 11a and connected with the first inner walls 11b and the second inner walls 11c.

[Burr Removing Step]

When the trenches 11 are formed as described above, a Si burr (burr) 11e is generated on the surface of the first inner walls 11b from the direction of the bottom portion 11d as shown in FIG. 7(c). The burr 11e will become a parasitic channel, and thus it is necessary to either remove or reduce it.

The present invention is characterized in that the cross sectional outline of the second inner walls 11c of the trenches 11 are formed substantially linearly, and that the burr removing step includes a first burr removing step in which the burr 11e is removed or reduced by a hydrogen baking treatment; a protection film forming step in which a protection film is formed on the surface of the trenches 11 by an oxidation treatment; and a second burr removing step in which the surface of the trenches 11 where the protection film is formed is subjected to a hydrogen baking treatment to further remove or reduce the remaining burr 11e while maintaining the cross sectional outline of the second inner walls 11c substantially linear. With such a configuration, Si migration inside the trenches 11 can actively be controlled due to the protection film, and thus the burr 11e can be removed while optimizing the shape of the trenches 11.

In addition, it is preferable that the height of the burr 11e from the bottom portion be either removed or reduced down to 20% or less in the first burr removing step, and that height of the burr 11e from the bottom portion be either removed or reduced down to 5 nm or less in the second burr removing step. With such a configuration, as shown in FIG. 3(a), it will be possible to minimize the ratio between the upper trench-width a and the intermediate trench-width b (=b/a), that is the side etching ratio in the cross sectional outline of the second inner walls 11c of the trenches 11, and to efficiently remove or reduce the burr 11e sufficiently while maintaining the flat shape of the bottom portion 11d in the cross section of the first inner walls 11b of the trenches 11, as shown in FIG. 3(b).

(First Burr Removing Step)

Figure 8:
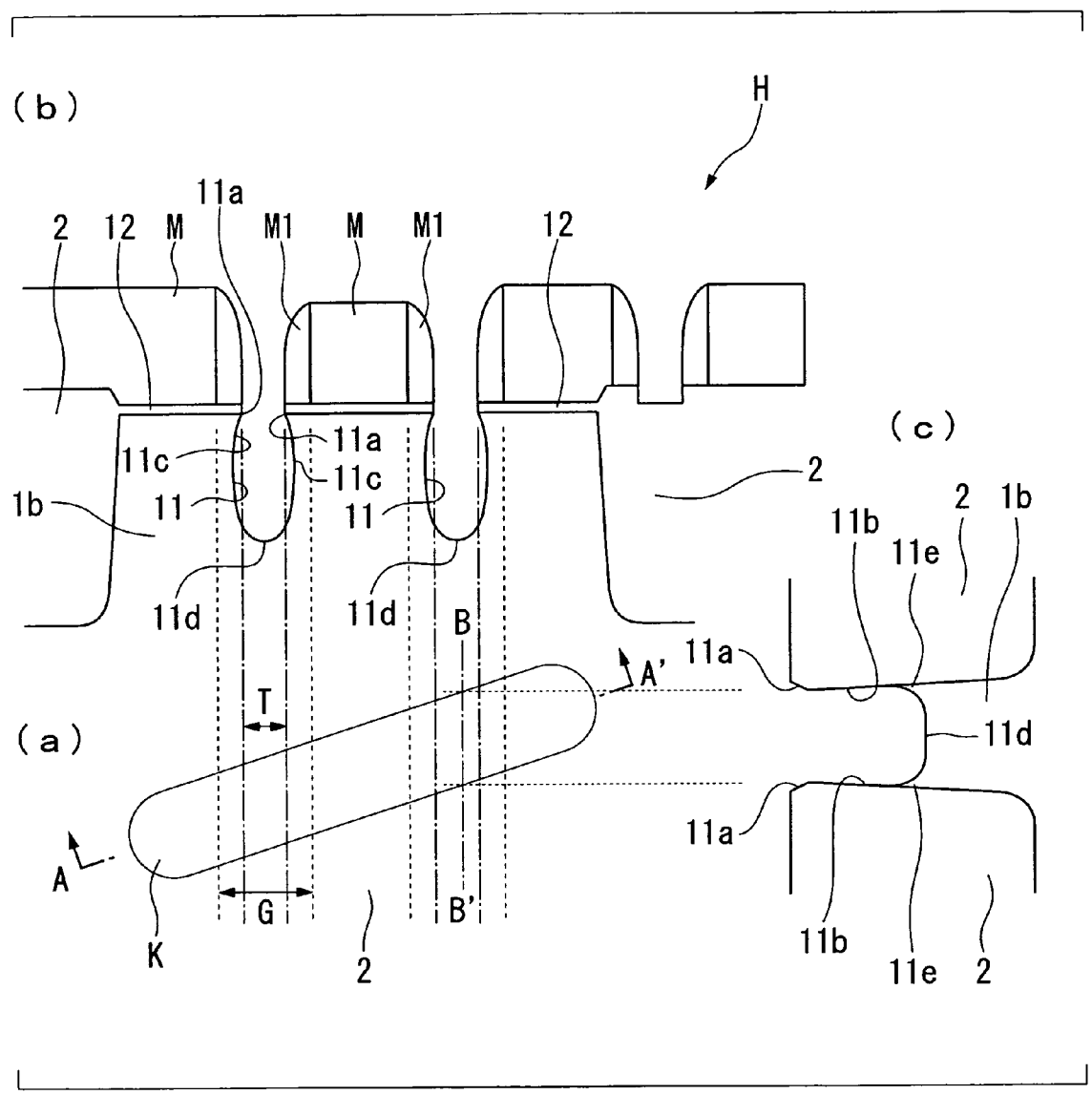
FIG. 8 is a flow chart when fabricating the semiconductor apparatus according to an embodiment of the present invention, and is a schematic diagram showing a state where a first burr removing step is carried out.

As shown in FIG. 8, the burr 11e is removed by the hydrogen baking treatment after removing the natural oxide film by a wet etching process. During this stage, it is preferable that height of the burr 11e from the bottom portion be either removed or reduced down to 20% or less.

The hydrogen baking treatment is a technique generally used for removing the natural oxide film on the surface before conducting a gate oxidation process or before the epitaxial growth of polysilicon. When the temperature is adjusted to around 900° C. in this treatment, it is known that Si atoms migrate changing the shape to one with a little stress. Since this migration does not occur in a region where an oxide film having a certain thickness (about 1 nm or more) is attached, it is possible to control the trench shape by combining with the protection film forming step described later in detail.

Since the Si migration greatly depends on the heating temperature, the temperature is preferably within a range of 800 to 900° C. in order to reduce the height of the burr 11e down to about 20% of its initial height in a short period of time, more preferably within a range of 820 to 870° C., and most preferably at about 850° C.

When the temperature exceeds 900° C., Si molecules migrate too much resulting in a dented burr portion, and the temperature around 875° C. will achieve a high side etching ratio. On the other hand, when the temperature is less than 800° C., the effects of the Si burr removal will be weakened resulting in a longer processing time.

Additionally, the flow rate of hydrogen gas in the hydrogen baking treatment is preferably at least 5 L/min or more, more preferably within a range of 8 to 12 L/min, and most preferably about 10 L/min. The flow rate within this range will achieve a low side etching ratio of the trenches and the effects of the Si burr removal will also be achieved sufficiently.

Moreover, pressure during the process is preferably about 20 Torr ($2.67 \times 10^3$ Pa). It has been disclosed that a high pressure will result in a high etching rate of the oxide film (refer to Japanese Unexamined Patent Application, First Publication No. 2005-079215).

(Protection Film Forming Step)

Figure 9:
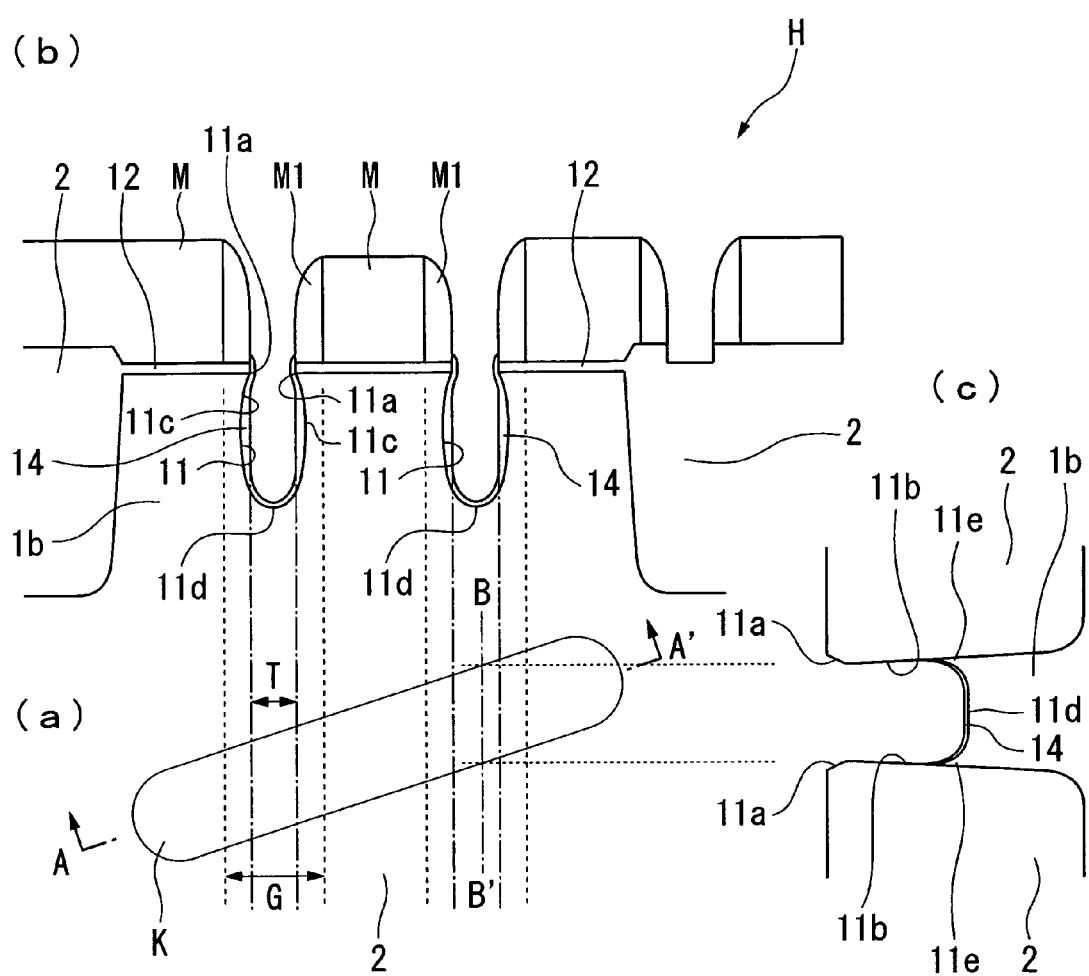
FIG. 9 is a flow chart when fabricating the semiconductor apparatus according to an embodiment of the present invention, and is a schematic diagram showing a state where a step for forming a protection film is carried out.

After conducting the first burr removing step, a protection film 14 is formed by an oxidation treatment as shown in FIG. 9. It is preferable that the protection film 14 be formed continuously so that its film thickness will be thick in the side of the opening portion 11a and thin in the side of the bottom portion 11d. With such a configuration, the film thickness will be inversely proportional to the thickness of the burr 11e, which is thick in the side of the bottom portion 11d and becomes thinner as it approaches the side of the opening portion 11a. Accordingly, it is possible to control the effects of the hydrogen baking treatment in the second burr removing step based on the thickness of the burr 11e, and thus the effects of burr removal will be optimal.

In addition, the oxidation treatment is preferably a dichloroethylene (DCE) oxidation treatment using DCE.

The DCE oxidation treatment is used for field (active region) oxidation or the like and refers to a furnace oxidation process in which about 1 to 2% of DCE is mixed. This oxidation method is highly effective in removing metal contamination since it involves chlorine. In addition, another feature of this method is the increase of oxidation rate as it approaches the substrate surface side. This feature is due to the presence of a damaged layer that is generated in the dry etching process at the edge of the pattern on the substrate surface side. In other words, since the damaged layer can be removed efficiently due to the action of chlorine, oxidation rate can be enhanced.

By conducting the oxidation treatment with, for example, a temperature within a range of 820 to 870° C. and a process time within a range of 75 to 125 seconds, it will be possible to form the protection film 14 with a sufficient thickness, which is also a moderate thickness that does not interfere in the burr removing step. As the oxidation methods other than the DCE oxidation process, a dry oxidation process and a wet oxidation process are known, for example. However, oxidation rate will be low in the wafer surface side since the abovementioned damaged layer cannot be removed by these methods.

On the other hand, in the case of DCE oxidation process, the damaged layer can be removed efficiently due to the action of chlorine resulting in a high oxidation rate. It is assumed that the cause of high oxidation rate in the wafer surface side is due to the large amount of chlorine gas in the surface side. The present invention exploits this property so that the burr 11e with a reduced height is oxidized as little as possible and the first inner walls 11b are oxidized and then protected by the protection film 14, thereby avoiding the shape change in the A-A' line direction during the second burr removing step which will be described next.

(Second Burr Removing Step)

The second burr removing step is carried out after conducting the protection film formation step.

Figure 10:
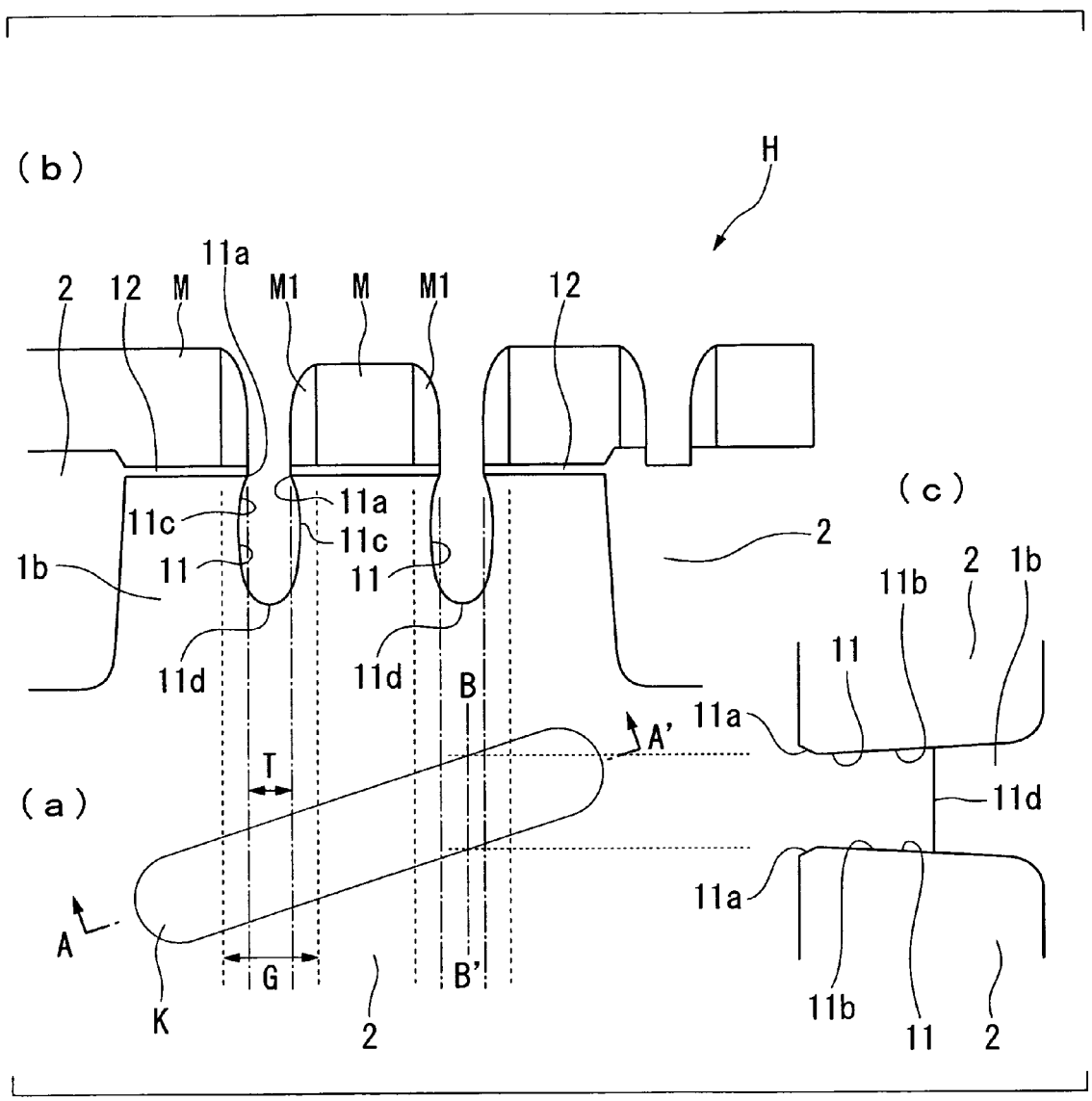
FIG. 10 is a flow chart when fabricating the semiconductor apparatus according to an embodiment of the present invention, and is a schematic diagram showing a state where a second burr removing step is carried out.

The surface of the trenches 11 where the protection film 14 is formed is subjected to a hydrogen baking treatment to further remove or reduce the remaining burr 11e while maintaining the cross sectional outline of the second inner walls 11c substantially linear as shown in FIG. 10. With such a configuration, Si migration inside the trenches 11 can actively be controlled due to the protection film 14, and thus the burr can be removed while optimizing the shape of the trenches 11.

It is preferable that height of the burr 11e from the bottom portion be either removed or reduced down to 5 nm or less in the second burr removing step. With such a configuration, as shown in FIG. 3(a), it will be possible to minimize the ratio between the intermediate trench-width b and the upper trench-width a (=b/a), that is the side etching ratio in the cross sectional outline of the second inner walls 11c, and to efficiently remove or reduce the burr 11e sufficiently while maintaining the flat shape of the bottom portion 11d in the cross section of the first inner walls 11b, as shown in FIG. 3(b).

As in the first burr removing step, since the Si migration greatly depends on the heating temperature, the temperature is preferably within a range of 800 to 900° C. in order to reduce the height of the burr 11e down to about 20% of its initial height in a short period of time, more preferably within a range of 820 to 870° C., and most preferably at about 850° C.

When the temperature exceeds 900° C., Si molecules migrate too much resulting in a dented burr portion, and the temperature around 875° C. will result in a high side etching ratio. On the other hand, when the temperature is less than 800° C., the effects of burr removal will be weakened resulting in a longer processing time.

In addition, during this process, it is necessary that the protection film 14 in the surface of the first inner walls 11b be reduced as little as possible, and that the conditions for the process be adjusted to a state, which is in short of gas and high in pressure, to make it difficult for the film to be incorporated in the narrow space in order to prevent the Si migration in the above region as much as possible.

For the above reason, the flow rate of hydrogen gas in the hydrogen baking treatment is preferably at least 5 L/min or more, more preferably within a range of 8 to 12 L/min, and most preferably about 10 L/min. The flow rate within this range will achieve a low side etching ratio of the trenches and the effects of burr removal will also be achieved sufficiently.

Moreover, pressure during the process is preferably about 20 Torr ($2.67 \times 10^3$ Pa), and a higher etching rate of the oxide film is achieved by increasing the pressure.

(Sacrificial Oxidation and Oxide Film Removing Step)

Figure 11:
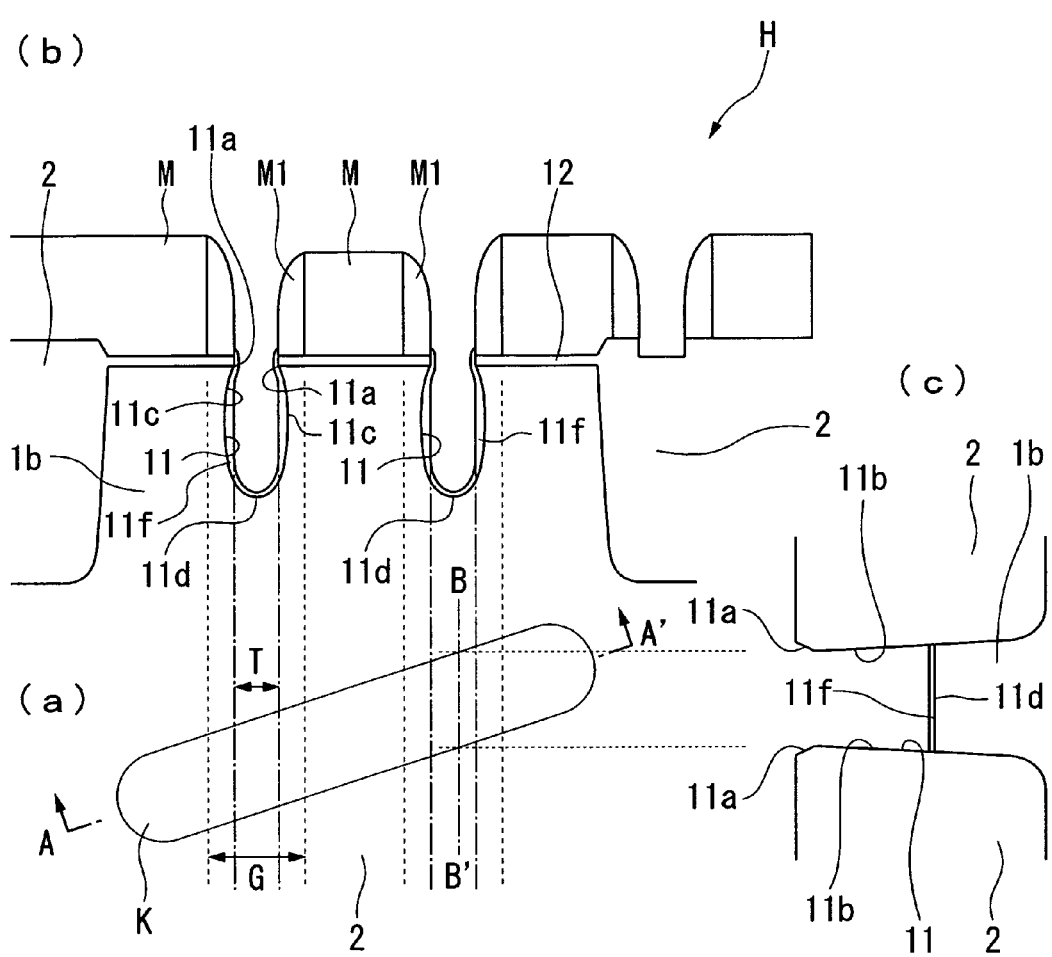
FIG. 11 is a flow chart when fabricating the semiconductor apparatus according to an embodiment of the present invention, and is a schematic diagram showing a state where an oxidation treatment is carried out.

After carrying out the second burr removing step, a sacrifice oxide film 11f is formed inside the trenches 11 by a sacrificial oxidation treatment such as an in situ steam generated (ISSG) oxidation treatment, as shown in FIG. 11.

Examples of the conditions for the sacrificial oxidation treatment include a treatment conducted at a temperature of 850 to 950° C. in an oxidizing atmosphere containing a halogenated organic gas such as dichloroethylene.

Figure 12:
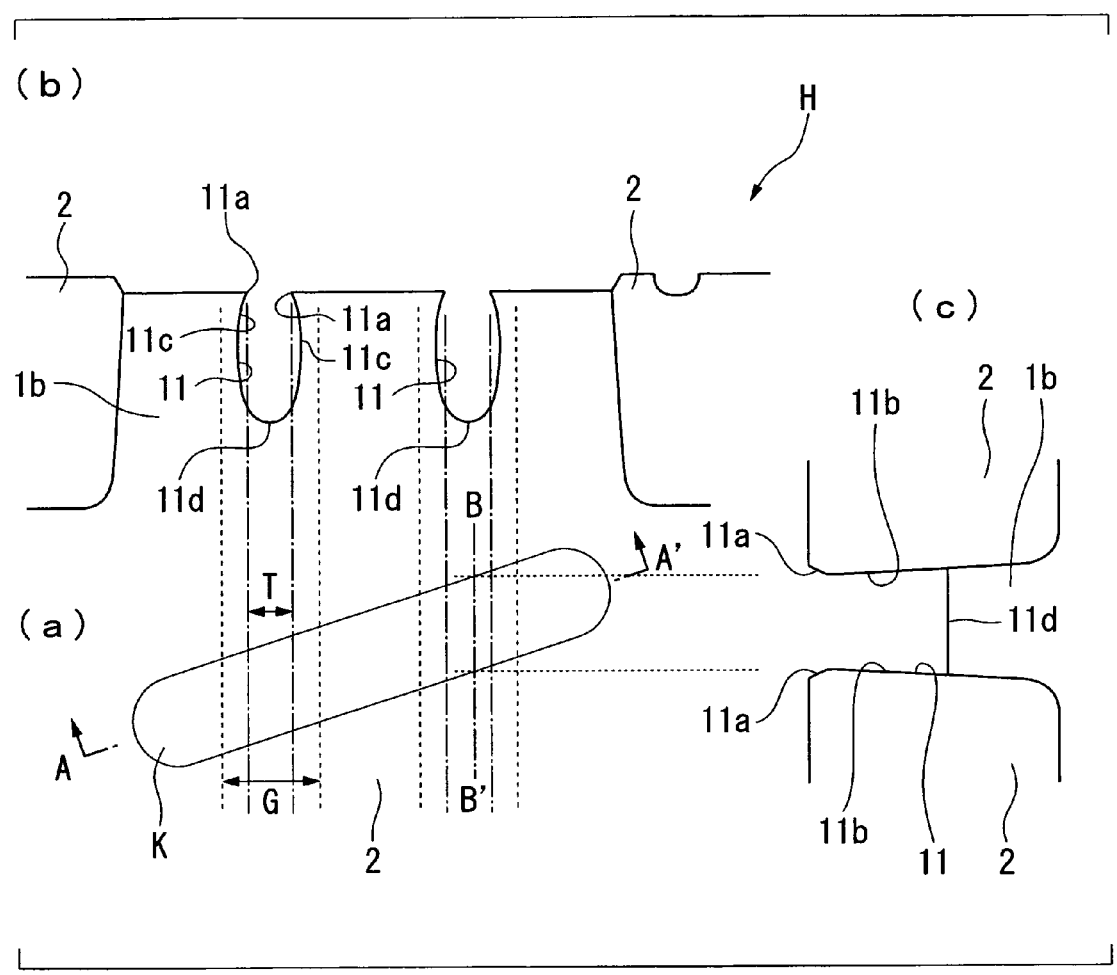
FIG. 12 is a flow chart when fabricating the semiconductor apparatus according to an embodiment of the present invention, and is a schematic diagram showing a state where a wet etching process is carried out.

Furthermore, as shown in FIG. 12, the nitride film and the oxide film (that is, the mask pattern M and the side walls M1) on the semiconductor substrate 1 are removed by the wet etching process.

[Gate Electrode Forming Step]

Then the gate insulating film 17 is formed by carrying out a thermal oxidation process. The insulating film 17 is formed on the semiconductor substrate 1 so as to trace the shape of the trenches 11 and its thickness is preferably about 10 nm.

Subsequently, due to a thermal oxidation process, for example, at 1,000° C. in a dry oxygen atmosphere, the gate electrode is formed by depositing a polycrystalline silicon film so as to fill in the trenches 11, the word line 7 is formed by depositing a metal film on the gate electrode 8, and the hard mask 15 made of an insulating film is formed on the word line 7, and they are subjected to an etching process.

[Diffusion Layer Forming Step]

Then the drain 3 and the sources 4a and 4b configured from an n-type diffusion layer are formed by implanting phosphorus and arsenic into the semiconductor substrate 1. Examples of the conditions for phosphorus implantation include an implant dose of $1 \times 10^{14}$ cm$^{-2}$ at an implant energy of 50 keV. Additionally, examples of the conditions for arsenic implantation include an implant dose of $1 \times 10^{15}$ cm$^{-2}$ at an implant energy of 20 keV. Moreover, after implanting these elements, a heat treatment at 1,000° C. for about 10 seconds is conducted for activating the elements.

Furthermore, the side walls 16 configured from an insulating film such as silicon nitride are formed on both side surfaces of the gate electrode, the word line 7 and the hard mask 15 made of an insulating film. The conductor portions 18b, 18a, and 18c are formed by lamination in the region sandwiched by the side walls 16 and on the upper portion of the side walls 16 so as to connect with each of the upper side of the drain 3 and the sources 4a and 4b, respectively.

As described above, the trench gate transistor (semiconductor apparatus H) shown in FIGS. 1 and 2 is completed.

Figure 13:
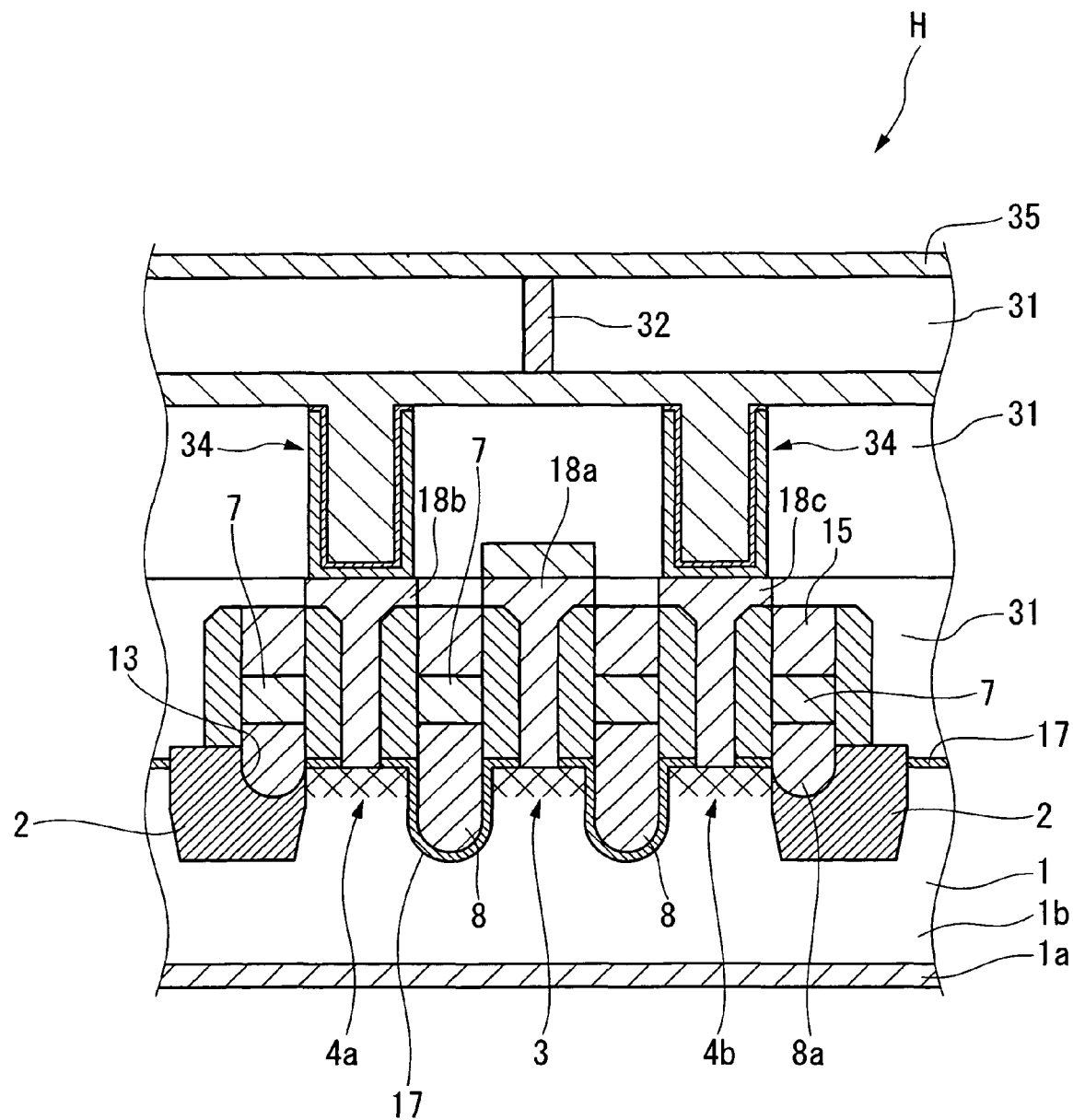
FIG. 13 is a cross sectional diagram showing the semiconductor apparatus according to an embodiment of the present invention.

Thereafter, in order to fabricate dynamic random access memory (DRAM) having the abovementioned trench gate transistor, various lines or a cell capacitor is laminated using a general method. That is, as shown in FIG. 13, by forming a plurality of interlayer insulating films 31 on the trench gate transistor and forming a contact plug 32 penetrating each of the interlayer insulating film 31, a bit line 33, a cell capacitor 34, an interconnection 35, or the like, a DRAM (semiconductor apparatus) that uses a trench-gate type asymmetric cell transistor as a transfer gate transistor in a memory cell is completed.

Figure 17:
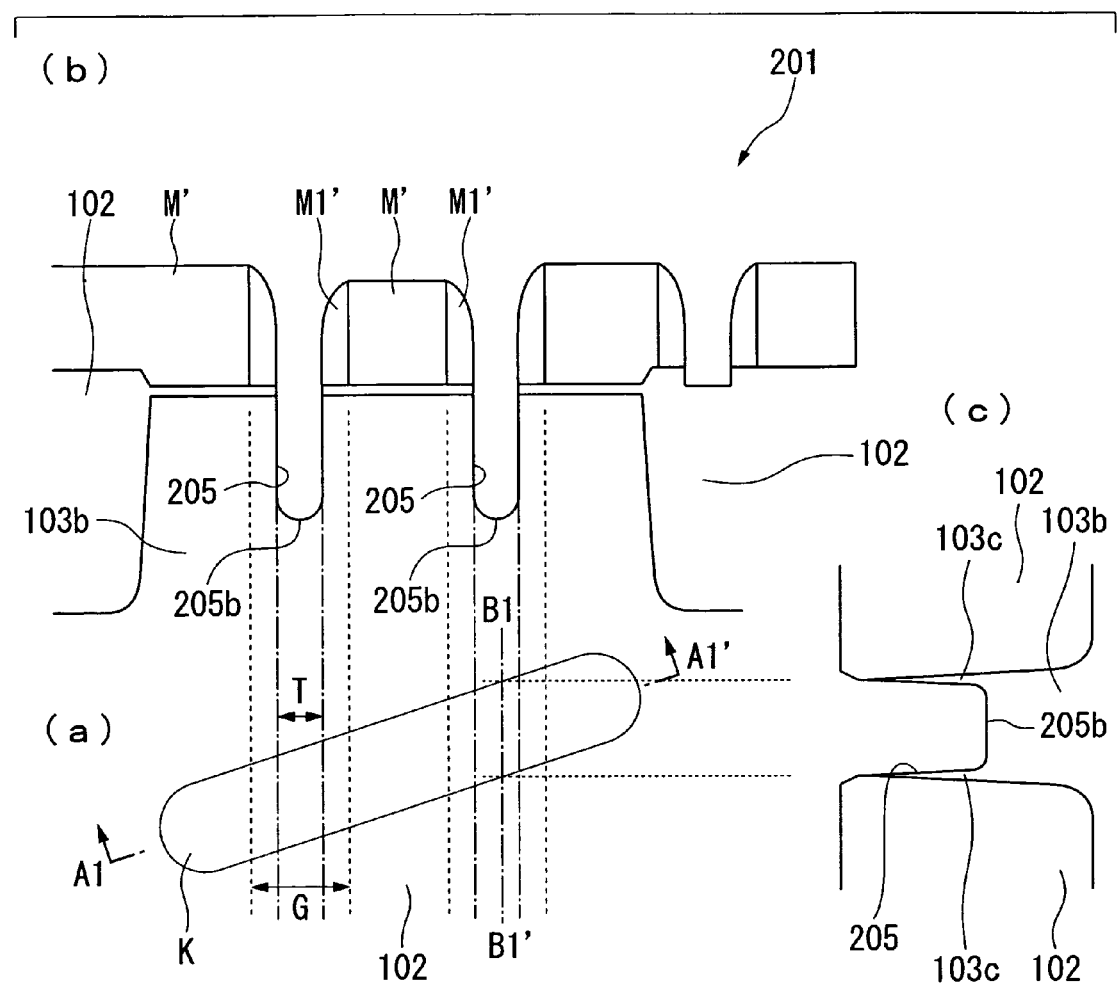
FIG. 17 is a flow chart when fabricating the conventional semiconductor apparatus, and is a schematic diagram showing a state where a trench gate is formed.
Figure 18:
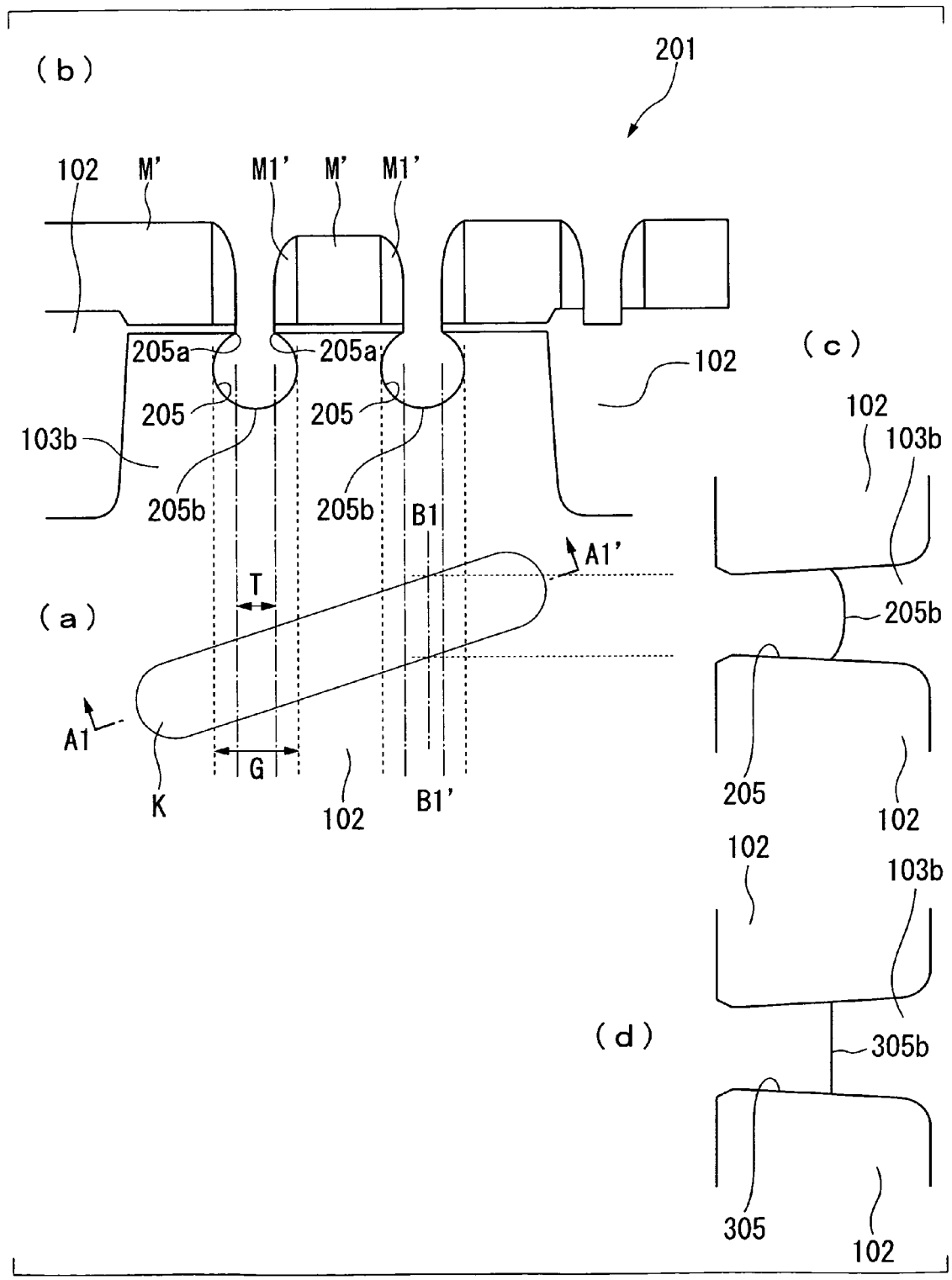
FIG. 18 is a flow chart when fabricating the conventional semiconductor apparatus, and is a schematic diagram showing a state where a hydrogen baking treatment is carried out.

A semiconductor substrate 201 is prepared as a conventional example, and as in the above case, a device isolation region 102 and an active region 10K are formed therein, trenches 205 are formed via a mask pattern M' and side walls M1', and Si burr is generated inside the trenches 205 as shown in FIG. 17. Note that when the semiconductor substrate 201 as described above is subjected to an isotropic chemical etching process to alleviate the extent of the Si burr 103c as shown in FIG. 17(c), a bottom portion 205b of the trenches 205 will become round as shown in FIG. 18(c), and thus the portion brought into contact with the device isolation insulating film (device isolation region) 102 will become higher compared to the bottom portion 205b, thereby making it impossible to completely eliminate the burr effects. Moreover, cross sectional shape of the trenches in the A1-A1' line direction will deteriorate due to excessive side etching.

In addition, there is also a disadvantage in that the mask is retracted making the upper trench-width larger since the fluorine-based gas is used.

Figure 19:
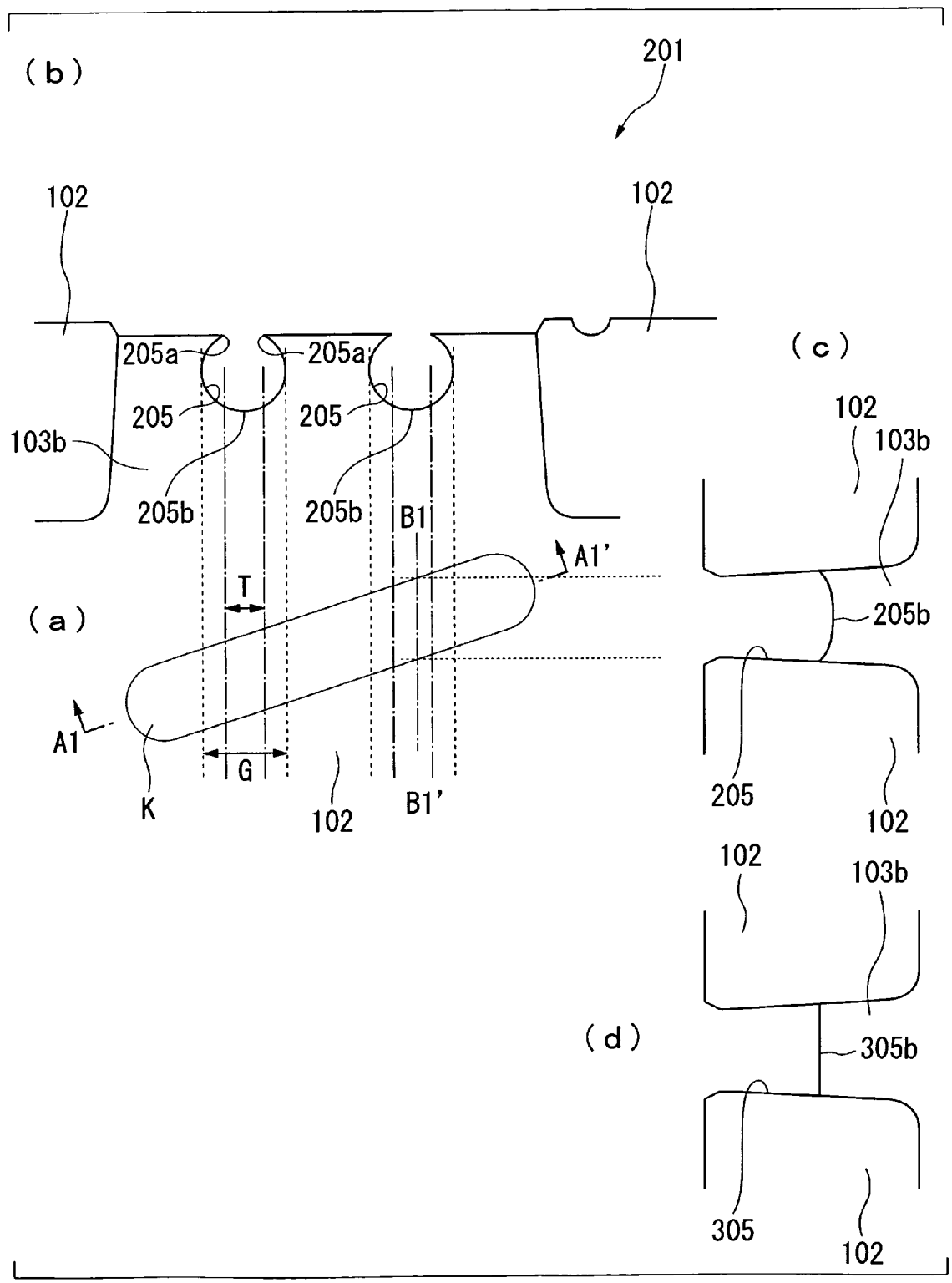
FIG. 19 is a flow chart when fabricating the conventional semiconductor apparatus, and is a schematic diagram showing a state where a mask is removed.
Figure 20:
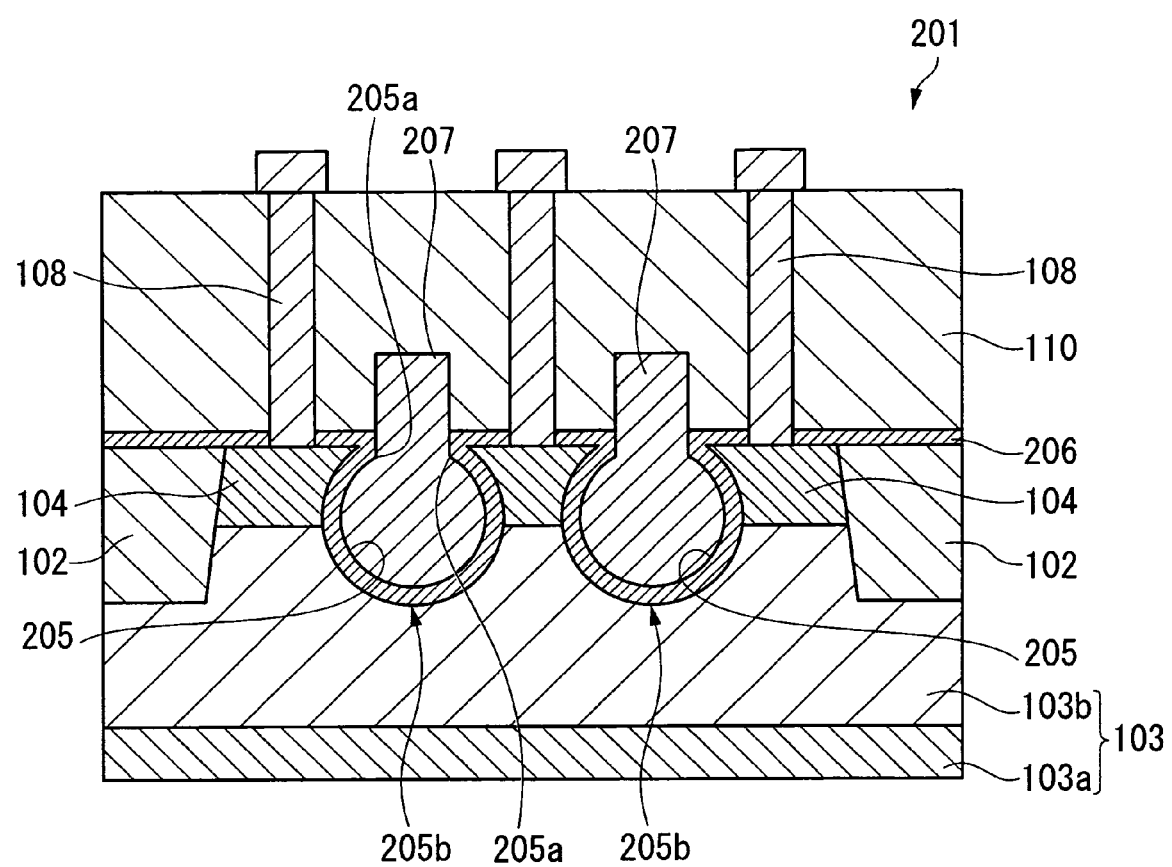
FIG. 20 is a cross sectional diagram of a semiconductor apparatus which is fabricated in a state where the trench shape is changed when removing the burr by the conventional method for fabricating a semiconductor apparatus.

Thereafter, as shown in FIG. 19, the trench 205 is formed by removing a mask. However, the cross sectional shape of the trench 205 will be substantially circular and the central portion thereof in the depth direction will be a rounded dent, and thus the trench upper portion 205a will have a shape projecting inward. When the transistor 201 is produced by embedding the gate electrode 207 in the trenches 205 via the gate insulating film 206 as shown in FIG. 20, electric field concentration readily occurs at the trench upper portion 205a and the risk of dimensional change will also be great.

On the other hand, when a hydrogen baking process (a heat treatment in a hydrogen atmosphere at about 900° C.) is conducted, as shown in FIG. 18(d), the Si burr 103c can be eliminated substantially completely making the bottom portion of the trench 305b flat. However, similar to the above-mentioned case, cross sectional shape of the trench in the direction of A1-A1' line will be substantially circular. Accordingly, when a transistor is produced as in the above case by removing a mask, electric field concentration readily occurs at the trench upper portion and the risk of dimensional change will also be great.

However, when the process flow of the present invention is applied, the upper trench-width a and the intermediate trench-width b will substantially be an ideal dimension and only the extent of burr 11e will become extremely close to 0. When it is necessary to make the Si burr completely flat, a light DCE oxidation treatment and a light hydrogen baking treatment may further be applied.

With the method for fabricating a semiconductor apparatus having the trench gate transistor structure of the present embodiment described so far, it is possible to fabricate a semiconductor apparatus in which the trench shape is optimized while efficiently removing the burr generated during the processing of the trench in the trench gate transistor, and which is free from problems such as the generation of a parasitic channel, electric field concentration, or a leakage current.

EXAMPLES

Next, Examples of the present invention will be described in detail.

A semiconductor apparatus H shown in FIGS. 1 and 2 was produced by the steps shown in FIGS. 4 to 12.

Examples 1 and 2

Optimal conditions for a hydrogen baking treatment and an oxidation treatment were studied and with respect to the sample in which the Si burr was generated after subjecting trenches to a silicon dry etching process, optimal conditions for a light hydrogen baking treatment and a light DCE oxidation treatment were examined.

(Sample Structure)

The sample shape after the dry etching process was like the one shown in FIG. 5.

(Dry Etching Apparatus)

A commercially available ICP plasma etching apparatus was used.

(Conditions for Silicon Dry Etching Process)

Conditions were: $HBr/Cl_2/O_2=100/90/10$ sccm, 10 mTorr (1.33 Pa), and RF (upper portion/lower portion)=500 W/100 W (stage temperature=10° C.).

(Standard Conditions for Hydrogen Baking Treatment)

Conditions were: $H_2=15$ L/min, 20 Torr ($2.67 \times 10^3$ Pa), 850° C., and 60 seconds.

The condition necessary for the hydrogen baking treatment was to satisfy both the following two requirements:

(1) To reduce the Si burr height down to about 20% of its initial height; and (2) To avoid the reduction of oxide film on the trench side surface in the direction perpendicular to the word line as much as possible, and to suppress Si migration in the above region as much as possible.

Since the Si migration greatly depends on the heating temperature, it is known that the temperature is preferably adjusted to about 900° C. in order to achieve the above requirement (1) in a short period of time. For the above reason, an experiment was conducted under a heating temperature of 800° C. to 900° C., and as shown in FIG. 3, the trench depth d, the upper trench-width a, the intermediate trench-width b, and the Si burr height h were measured with respect to the formed trenches 11, and the side etching ratio (b/a) and the angle θ were calculated. Results are shown in Table 1.

TABLE 1

|  | Ex. 1 | Comp. Ex. 1 | Comp. Ex. 2 | Comp. Ex. 3 | Comp. Ex. 4 |
| --- | --- | --- | --- | --- | --- |
| Treatment temperature (° C.) | 850 | No treatment | 800 | 875 | 900 |
| Trench depth (d) | 130.8 | 165.1 | 145.3 | 116.5 | 115.2 |
| Upper trench-width (a) | 76.6 | 77.3 | 77.6 | 81.6 | 99.1 |
| Intermediate trench-width (b) | 79.1 | 67.9 | 72.4 | 87.9 | 105.3 |
| Height of Si burr (h)* | 9.3 | 56.6 | 27.5 | 0 | −11.8 |
| Side etching ratio (b/a) | 1.03 | 0.88 | 0.93 | 1.08 | 1.06 |

*Height of Si burr after first burr removal step

**The unit of measurement is nanometers.

As shown in Table 1, the Si burr height could be reduced to less than 20% of its initial height at a temperature of 850° C. or more. At a temperature of 900° C., the extent of Si migration was excessive resulting in a dented Si burr portion.

Since the side etching ratio of the trenches was high in the direction perpendicular to the word line at a temperature of 875° C., it can be concluded that the temperature condition of 850° C. is optimal.

Next, the conditions for satisfying the above requirement (2) were examined. In order to achieve the requirement (2), it is necessary to prepare the conditions of gas shortage and high pressure so as to make it difficult for the film to be incorporated in the narrow space. Since it was already known from the prior art document (Japanese Unexamined Patent Application, First Publication No. 2005-079215) that a high pressure will result in a high etching rate of the oxide film, dependency on $H_2$ flow rate (5 to 20 L/min) was examined here. Results are shown in Table 2.

TABLE 2

|  | Ex. 2 | Comp. Ex. 1 | Comp. Ex. 5 | Comp. Ex. 6 | Comp. Ex. 7 |
| --- | --- | --- | --- | --- | --- |
| Amount of hydrogen supply (L/min) | 10 | No treatment | 5 | 15 | 20 |
| Trench depth (d) | 135.2 | 165.1 | 155.6 | 130.8 | 120.4 |
| Upper trench-width (a) | 77.1 | 77.3 | 76.8 | 76.6 | 80.8 |
| Intermediate trench-width (b) | 74.3 | 67.9 | 71.9 | 79.1 | 85.3 |
| Height of Si burr (h)* | 9.8 | 56.6 | 23.3 | 9.3 | 7.9 |
| Side etching ratio (b/a) | 0.96 | 0.88 | 0.94 | 1.03 | 1.06 |

*Height of Si burr after first burr removal step
**The unit of measurement is nanometers.

As shown in Table 2, the side etching ratio of the trenches was low when the flow rate was 10 L/min and since the effects of Si burr removal were not impaired to a great extent, it can be concluded that the optimal $H_2$ flow rate is 10 L/min.

Test Example

Figure 14:
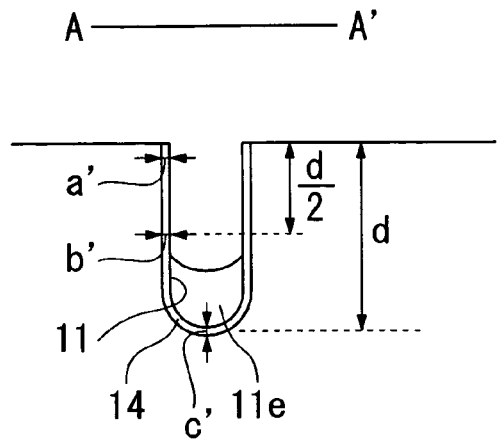
FIG. 14 is a diagram illustrating a method for measuring the thickness of a trench oxide film, and is a cross sectional diagram as seen along the A-A' line in FIG. 7(a).
Figure 15:
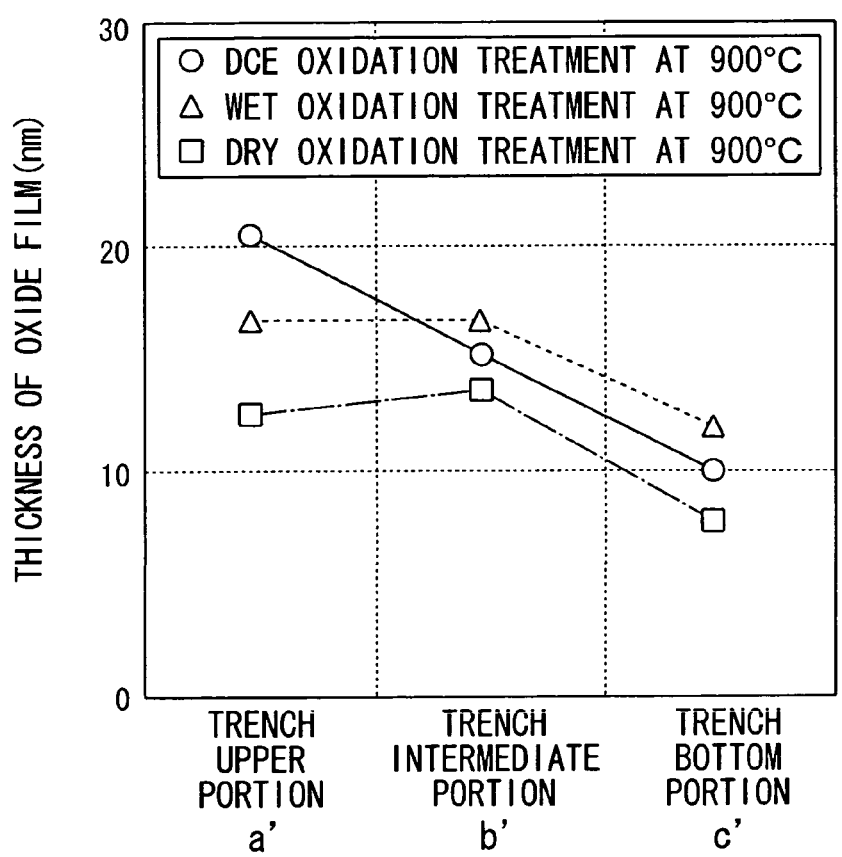
FIG. 15 is a diagram comparing distributions of oxide film thickness in the depth direction of a trench in test examples using different oxidation methods.
Figure 16:
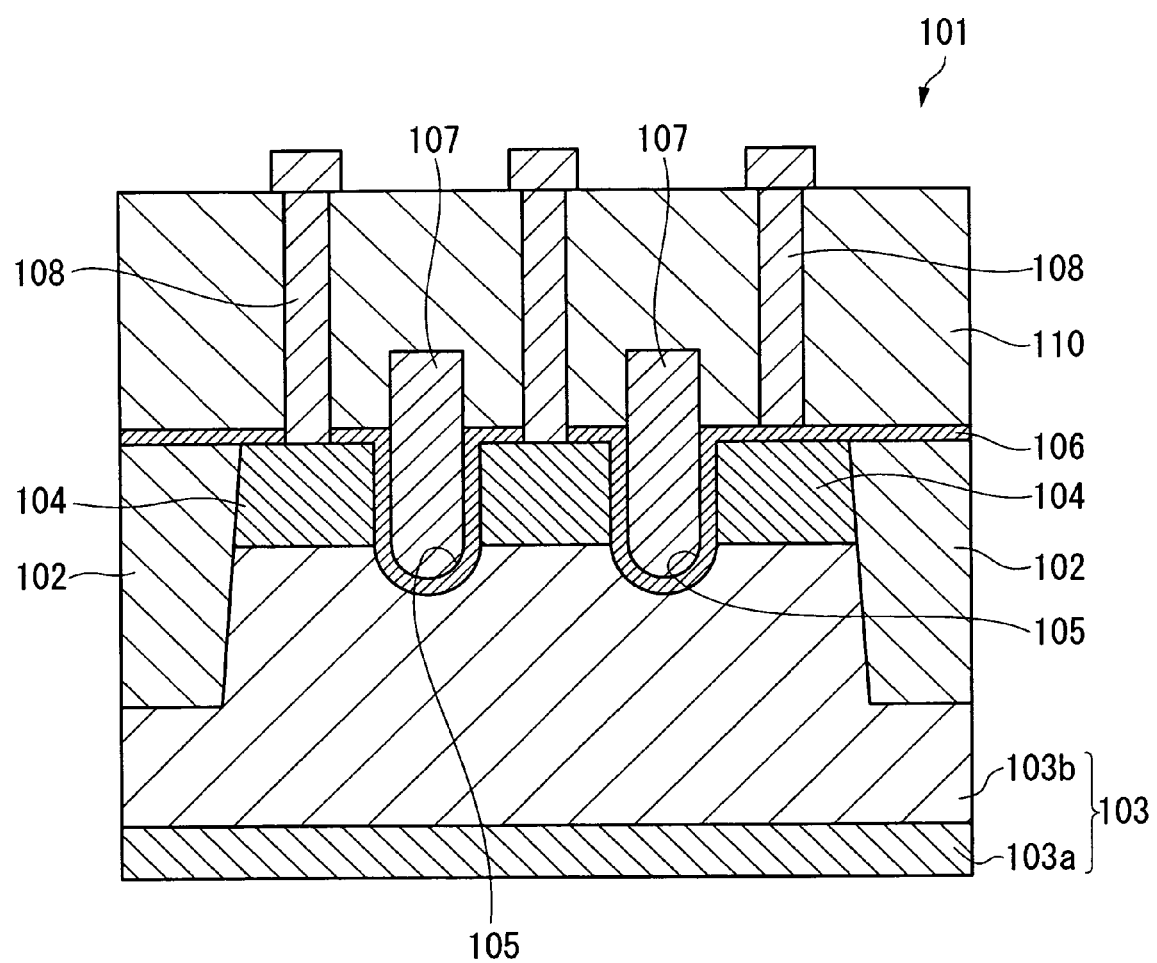
FIG. 16 is a cross sectional diagram showing a conventional semiconductor apparatus.

As a necessary condition for the oxidation treatment, it is preferable to increase the thickness of the oxide film as it approaches the upper side of the trench side surface and reduce the thickness of oxide film as it approaches the area close to the trench bottom. For the above reason, in order to examine the depth dependency of oxide film with respect to three different oxidation methods (i.e., a dry oxidation method, a wet oxidation method, and a DCE oxidation method), the upper film thickness a', the intermediate film thickness b', and the bottom film thickness c' were each measured, as shown in FIG. 14. Results are shown in FIG. 15.

From these results, it can be concluded that the DCE oxidation method which achieves a large film thickness of the oxide film at a trench upper portion is optimal in order to achieve a desired distribution of oxide film thickness.

Example 3

Next, optimal conditions in terms of temperature and time with respect to the most effective DCE oxidation treatment were examined. In order to avoid depositing oxide film on the Si burr portion, the temperature was adjusted to 850° C., which was the lower limit set in the apparatus used, and the optimal time condition (50, 100, 150, and 200 seconds) was examined here. The upper film thickness a', the intermediate film thickness b', and the bottom film thickness c' were measured, and their ratio (i.e., a'/b' and b'/c') was calculated. Results are shown in Table 3.

TABLE 3

|  | Ex. 3 | Comp. Ex. 8 | Comp. Ex. 9 | Comp. Ex. 10 |
| --- | --- | --- | --- | --- |
| Oxidation treatment time (seconds) | 100 | 50 | 150 | 200 |
| Upper film thickness (a') | 1.5 | 1.0 | 1.8 | 2.1 |
| Intermediate film thickness (b') | 1.3 | 0.85 | 15 | 1.8 |
| Bottom film thickness (c') | 0.83 | 0.71 | 1.1 | 1.2 |
| a'/c' | 1.8 | 1.4 | 1.6 | 1.7 |
| b'/c' | 1.6 | 1.2 | 1.4 | 1.5 |

* The unit of measurement is nanometers.

As shown in Table 3, it became apparent that time of 50 seconds was too short resulting in an oxide film with too small overall thickness, and that differences in terms of film thickness from that of the bottom portion were also difficult to achieve. In addition, 150 seconds resulted in the film thickness exceeding 1 nm even at the trench bottom portion, and thus it was possible that the effects of Si burr reduction may decline.

For the above reasons, it was concluded that the optimal time condition for the light DCE oxidation treatment is 100 seconds.

From the above experimental results, the process flow of the present invention is preferably carried out under the following conditions.

(After Si Dry Etching Operation on Trench Gate)

(1) Light Hydrogen Baking Treatment (First Treatment)

Conditions for hydrogen baking treatment were: $H_2$=10 L/min, 20 Torr ($2.67 \times 10^3$ Pa), 850° C., and 60 seconds.

(2) Light DCE Oxidation Treatment

Conditions for the DCE oxidation treatment were: $N_2$ (i.e. a carrier gas of DCE)=0.1 L/min, $O_2$=5 L/min, 850° C., and 100 seconds.

(3) Light Hydrogen Baking Treatment (Second Treatment)

Conditions for the hydrogen baking treatment were: $H_2$=10 L/min, 20 Torr ($2.67 \times 10^3$ Pa), 850° C., and 60 seconds as in the first treatment.

The treatments (1) and (2) are repeated if necessary. Thereafter, the ISSG oxidation treatment and the mask wet etching process may be carried out.

Example 4

As a comparison with other processing methods, the removal of the Si burr generated aside the STI during the dry etching process when forming a trench gate in the DRAM was tested using several methods and the resulting shapes were compared.

(Sample Structure)

The sample shape after the dry etching process was like the one shown in FIG. 5.

(Dry Etching Apparatus)

A commercially available ICP plasma etching apparatus was used.

(Conditions for Silicon Dry Etching Process)

Conditions were: $HBr/Cl_2/O_2$=100/90/10 sccm, 10 mTorr (1.33 Pa), and RF (upper portion/lower portion)=500 W/100 W (stage temperature=10° C.).

(Conditions for Chemical Dry Etching Process)

Conditions were: $CF_4/Ar$=100/100 sccm, pressure=20 mTorr (2.67 Pa), and RF (upper portion/lower portion)=500 W/0 W (stage temperature=10° C.).

(Sole Hydrogen Baking Treatment)

Conditions for the hydrogen baking treatment were: $H_2$=15 L/min, 20 Torr ($2.67 \times 10^3$ Pa), 850° C., and 60 seconds.

(Method of the Present Invention: Hydrogen Baking Treatment+DCE Oxidation Treatment)

Conditions for the light hydrogen baking treatment were: $H_2$=10 L/min, 20 Torr ($2.67 \times 10^3$ Pa), 850° C., and 60 seconds.

Conditions for the light DCE oxidation treatment were: $N_2$ (i.e. a carrier gas of DCE)=0.1 L/min, $O_2$=5 L/min, 850° C., and 100 seconds.

The trench depth d, the upper trench-width a, the intermediate trench-width b, the Si burr height h, and the angle θ were measured with respect to the formed trenches 11, and the side etching ratio (b/a) was calculated. Results are shown in Table 4.

TABLE 4

|  | Ex. 4 | Comp. Ex. 1 | Comp. Ex. 11 | Comp. Ex. 12 |
| --- | --- | --- | --- | --- |
| Method for burr removal | Process flow of the present invention | No treatment | Chemical dry etching process | Only hydrogen baking treatment (875° C.) |
| Trench depth (d) | 125.4 | 165.1 | 179.3 | 116.5 |
| Upper trench-width (a) | 78.0 | 77.3 | 83.1 | 81.6 |
| Intermediate trench-width (b) | 75.1 | 67.9 | 86.4 | 87.9 |
| Height of Si burr (h) | 2.8 | 56.6 | 18.4 | 0 |
| Side etching ratio (b/a) | 0.96 | 0.88 | 1.04 | 1.08 |

* The unit of measurement is nanometers.

As shown in Table 4, although the chemical dry etching process efficiently removed the Si burr, since the trench bottom will be a round shape, the portion contacting the STI oxide film became about 20 nm higher than the trench bottom. In addition, there is also a disadvantage in that the mask is retracted making the upper trench-width larger since the fluorine-based gas is used.

From the results where the hydrogen baking treatment was conducted, the Si burr could be removed completely. However, in that case, the trench inner walls in the direction perpendicular to the word line were retracted greatly.

On the other hand, when the process flow of the present invention was applied, the upper trench-width a and the intermediate trench-width b will substantially be an ideal dimension and only the extent of the Si burr will become extremely close to 0. When it is necessary to make the Si burr completely flat, a light DCE oxidation treatment and a light hydrogen baking treatment may further be applied.

INDUSTRIAL APPLICABILITY

The present invention can be widely used for a device installing a trench gate structure, and for a fabrication method thereof.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for fabricating a semiconductor apparatus, which is a method for fabricating a semiconductor apparatus having a trench gate transistor, the method comprising at least:

a step of providing a device isolation insulating film and an active region in a semiconductor substrate;

a step of forming a trench in the active region;

a step of removing or reducing a burr generated inside the trench; and a step of forming a gate insulating film inside the trench as well as forming a gate electrode in the trench, wherein the trench is provided so that both ends thereof are brought into contact with the device isolation insulating film, and the semiconductor apparatus is configured from an opening portion positioned on one surface of the semiconductor substrate, a pair of first inner walls positioned in a side of the device isolation insulating film and connected with the opening portion, a pair of second inner walls positioned in a side of the active region and connected with the opening portion, and a bottom portion is positioned opposite to the opening portion and connected with the first inner walls and the second inner walls, wherein a step of removing or reducing the burr further comprises:

a first burr removing step in which the burr is removed or reduced by a hydrogen baking treatment;

a protection-film forming step following said first burr removing step in which a protection film is formed on a surface of the trench by an oxidation treatment; and a second burr removing step following said protection-film forming step, in which the surface of the trench where the protection film is formed is subjected to a hydrogen baking treatment to further remove or reduce the remaining burr.

2. The method for fabricating a semiconductor apparatus according to claim 1, wherein the cross sectional outline of the second inner walls is formed so that a ratio between an intermediate trench-width and an upper trench-width is within a range of 0.9 to 1.05.

3. The method for fabricating a semiconductor apparatus according to claim 2, wherein the height of the burr from the bottom portion is removed or reduced down to 20% or less in the first burr removing step, and the height of the burr from the bottom portion is removed or reduced down to 5 nm or less in the second burr removing step.

4. The method for fabricating a semiconductor apparatus according to claim 1, wherein the height of the burr from the bottom portion is removed or reduced down to 20% or less in the first burr removing step, and the height of the burr from the bottom portion is removed or reduced down to 5 nm or less in the second burr removing step.

5. The method for fabricating a semiconductor apparatus according to claim 1, wherein the hydrogen baking treatment is conducted so that a flow rate of hydrogen gas is at least 5 L/min or more, and the baking treatment is carried out at a temperature of 800 to 900° C.

6. The method for fabricating a semiconductor apparatus according to claim 1, wherein the protection film is formed continuously so that a film thickness thereof is thick in a side of the opening portion and thin in a side of the bottom portion.

7. The method for fabricating a semiconductor apparatus according to claim 1, wherein the oxidation treatment is carried out by using at least dichloroethylene.

8. A method for fabricating a semiconductor apparatus, said method comprising:
   a first step in which a trench for a trench gate is formed in a region sandwiched by device isolation portions, and a burr is formed between the trench and the device isolation portions;
   a second step, following said first step, in which a treatment for reducing the burr is carried out by a hydrogen baking treatment;
   a third step, following said second step, in which an oxidation treatment is carried out so that a higher side is more oxidized than a lower side inside the trench; and
   a fourth step, following said third step, in which a treatment for reducing the burr is carried out by a second hydrogen baking treatment.

9. The method for fabricating a semiconductor apparatus according to claim 8, wherein the treatment in the second and the fourth steps is a heat treatment.

10. The method for fabricating a semiconductor apparatus according to claim 8, wherein the heat treatment is a hydrogen baking treatment in which a flow rate of hydrogen gas is at least 5 L/min or more and the baking treatment is carried out at a temperature of 800 to 900° C.

11. A method of fabricating a semiconductor apparatus said method, comprising:
   forming a device isolation region to define an active region in a semiconductor substrate;
   forming a trench crossing to the active region, following said forming of the device isolation region, the trench including a burr at a side surface of the trench in the active region;
   performing a first hydrogen baking treatment to remove a part of the burr, following said forming the trench;
   forming a protection film on the burr by an oxidation treatment, following said first hydrogen baking treatment; and
   performing a second hydrogen baking treatment to remove the burr, following said forming the protection film.

12. The method according to claim 11, wherein a height of the burr is reduced to 20% thereof or less by the first hydrogen baking treatment.

13. The method according to claim 12, wherein a height of the burr is reduced to 5% of the original height of the burr or less by the second hydrogen baking treatment.

14. The method according to claim 11, wherein both the first and second hydrogen baking treatments are performed so that a flow rate of hydrogen gas is set to be at least 5 L/min, or more, and a baking temperature is set from 800° C. to 900° C.

15. The method according to claim 11, wherein the protection film is formed so that a film thickness thereof near an opening portion of the trench is thicker than a film thickness thereof at a bottom portion of the trench.

16. The method according to claim 15, wherein the oxidation treatment is carried out by using dichloroethylene.

17. The method according to claim 16, wherein the oxidation treatment is carried out at a temperature from 820° C. to 870° C.

18. The method according to claim 11, further comprising:
   forming a gate insulating film on an inner surface of the trench after performing the second hydrogen baking treatment; and
   forming a gate electrode on the gate insulating film in the trench.

* * * * *